(12) United States Patent
Fujiwara et al.

(10) Patent No.: US 9,412,742 B2
(45) Date of Patent: Aug. 9, 2016

(54) LAYOUT DESIGN FOR MANUFACTURING A MEMORY CELL

(71) Applicant: TAIWAN SEMICONDUCTOR MANUFACTURING COMPANY, LTD., Hsinchu (TW)

(72) Inventors: Hidehiro Fujiwara, Hsinchu (TW); Kao-Cheng Lin, Taipei (TW); Ming-Yi Lee, Zhudong Township (TW); Yen-Huei Chen, Jhudong Township (TW); Hung-Jen Liao, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/300,703

(22) Filed: Jun. 10, 2014

(65) Prior Publication Data

US 2015/0357279 A1    Dec. 10, 2015

(51) Int. Cl.
| | |
|---|---|
| *H01L 27/11* | (2006.01) |
| *H01L 27/092* | (2006.01) |
| *G06F 17/50* | (2006.01) |
| *H01L 27/02* | (2006.01) |

(52) U.S. Cl.
CPC .......... *H01L 27/092* (2013.01); *G06F 17/5077* (2013.01); *H01L 27/0207* (2013.01); *H01L 27/1104* (2013.01)

(58) Field of Classification Search
CPC . H01L 23/528; H01L 23/535; H01L 27/0207; H01L 27/11; H01L 27/1104
See application file for complete search history.

(56) References Cited

U.S. PATENT DOCUMENTS

| | | | | |
|---|---|---|---|---|
| 6,229,186 B1 * | 5/2001 | Ishida | ........... | G11C 11/412 257/206 |
| 7,483,332 B2 * | 1/2009 | Houston | ........... | G11C 7/1051 365/154 |
| 7,671,422 B2 * | 3/2010 | Wang | ........... | G11C 11/412 257/369 |
| 7,973,371 B2 * | 7/2011 | Furuta | ........... | G11C 11/412 257/369 |
| 7,999,385 B2 * | 8/2011 | Ooka | ........... | H01L 27/0207 257/758 |
| 8,294,212 B2 * | 10/2012 | Wang | ........... | G11C 11/412 257/347 |
| 2014/0306296 A1 * | 10/2014 | Jeon | ........... | H01L 27/1104 257/401 |

* cited by examiner

*Primary Examiner* — Allison P Bernstein
(74) *Attorney, Agent, or Firm* — Hauptman Ham, LLP

(57) ABSTRACT

A layout design usable for manufacturing a memory cell includes a first and second active area layout pattern associated with forming a first and second active area, an isolation region outside the first and second active area, a first polysilicon layout pattern associated with forming a first polysilicon structure, a second polysilicon layout pattern associated with forming a second polysilicon structure, a first interconnection layout pattern associated with forming a first interconnection structure, and a second interconnection layout pattern associated with forming a second interconnection structure. The first active area does not overlap the second active area. The first polysilicon layout pattern overlaps the first active area layout pattern. The second polysilicon layout pattern overlaps the first active area layout pattern and the second active area layout pattern. The first interconnection layout pattern overlaps the second active area layout pattern. The second interconnection layout pattern overlaps the isolation region.

20 Claims, 18 Drawing Sheets

LAYOUT DESIGN FOR MANUFACTURING A MEMORY CELL

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, the effects of cross-talk and wiring resistance further affect IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
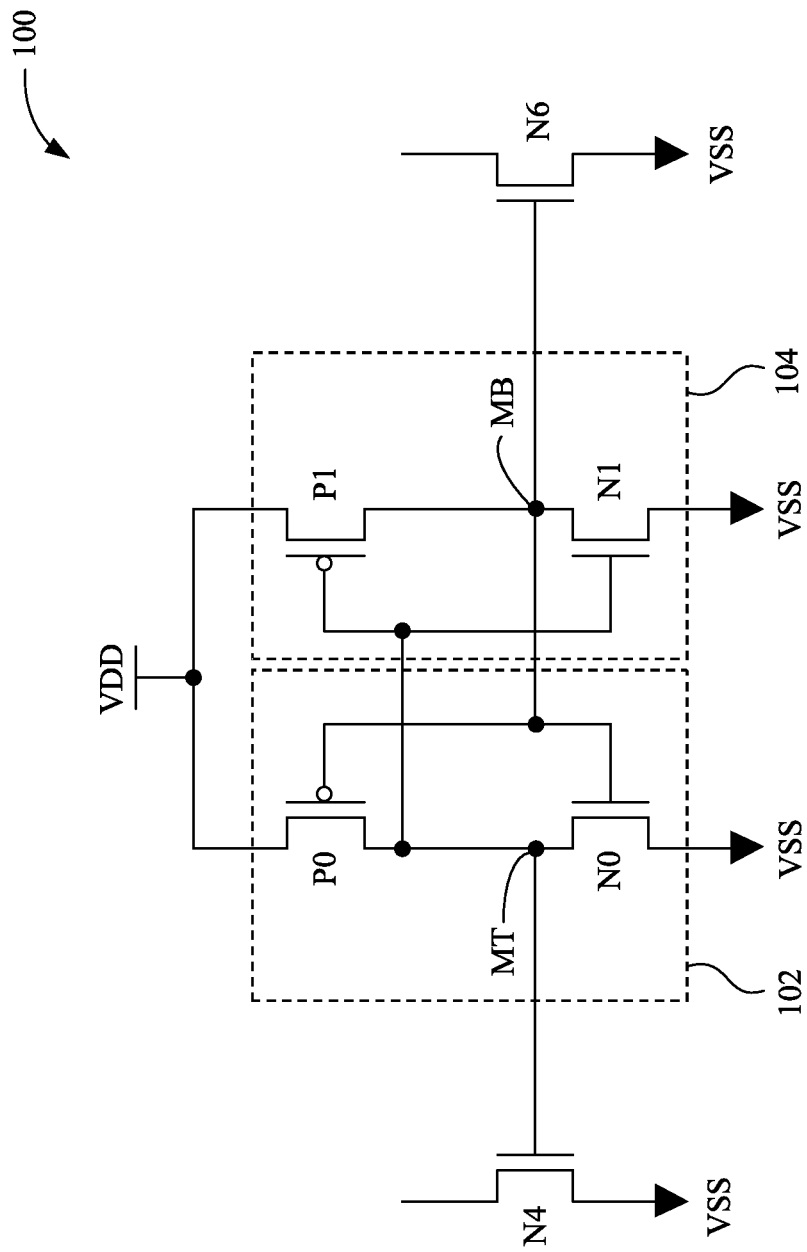
FIG. 1 is a schematic diagram of a portion of a memory cell in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a portion of a memory cell 100 in accordance with one or more embodiments. In some embodiments, memory cell 100 is a portion of one or more dual port (DP) SRAM cells. In some embodiments, memory cell 100 is a portion of one or more three port (3P) SRAM cells. In some embodiments, memory cell 100 is a portion of one or more four port (4P) SRAM cells. In some embodiments, write ports or read ports are a part of memory cell 100. In some embodiments, additional write ports and/or read ports are a part of memory cell 100. In some embodiments, memory cell 100 employs a number of transistors other than six. In some embodiments, memory cell 100 is usable in a memory cell array. The schematic diagram of memory cell 100 is a basis to be modified to form other structures, such as those described herein, e.g., FIGS. 5A, 6A and 7A.

Memory cell 100 includes cross-coupled inverter 102 connected to n-type metal oxide semiconductor (NMOS) transistor N4 and cross-coupled inverter 104 connected to NMOS transistor N6. In some embodiments, cross-coupled inverters 102 and 104 form a storage unit. In some embodiments, memory cell 100 includes three-dimensional gate structures, e.g., fin field-effect-transistors (FinFET). In some embodiments, memory cell 100 is a portion of a 3-Dimensional (3D) structure enabling ultra-high density integration at the individual transistor-level. In a 3D IC, each of the device layers is fabricated sequentially and is stacked upon the preceding layer.

The cross-coupled inverter 102 includes p-type metal oxide semiconductor (PMOS) transistor P0 and NMOS transistor N0. The cross-coupled inverter 104 includes PMOS transistor P1 and NMOS transistor N1.

The source terminal of each PMOS transistor P0, P1 is electrically connected to a power supply voltage (VDD) terminal. The drain terminal of each PMOS transistor P0, P1 is separately electrically connected to the drain terminal of each NMOS transistor N0, N1 at corresponding nodes MT and MB. A gate terminal of PMOS transistor P0 is electrically connected to a gate terminal of NMOS transistor N0 and the drain terminal of NMOS transistor N1. Similarly, a gate terminal of PMOS transistor P1 is electrically connected to a gate terminal of NMOS transistor N1 and the drain terminal of NMOS transistor N0. The source terminal of each NMOS transistor N0, N1 is electrically connected to a ground reference node VSS. In some embodiments, ground reference node VSS corresponds to a ground voltage.

The gate of NMOS transistor N4 is connected to cross-coupled inverter 102 by node MT. The source of NMOS transistor N4 is connected to a ground reference node (VSS). The drain of NMOS transistor N4 is configured to be floating. In some embodiments, the drain of NMOS transistor N4 is configured to selectively connect cross-coupled inverter 102 to a bit line or bit line bar. Note that the term "bar" as used in this context indicates a logically inverted signal. In some embodiments, the drain of NMOS transistor N4 is configured to selectively connect cross-coupled inverter 102 to one or more transistors.

The gate of NMOS transistor N6 is connected to cross-coupled inverter 104 by node MB. The source of NMOS transistor N6 is connected to a ground reference node (VSS). The drain of NMOS transistor N6 is configured to be floating. In some embodiments, the drain of NMOS transistor N6 is configured to selectively connect cross-coupled inverter 104 to a bit line or bit line bar. In some embodiments, the drain of NMOS transistor N6 is configured to selectively connect cross-coupled inverter 104 to one or more transistors.

Figure 2:
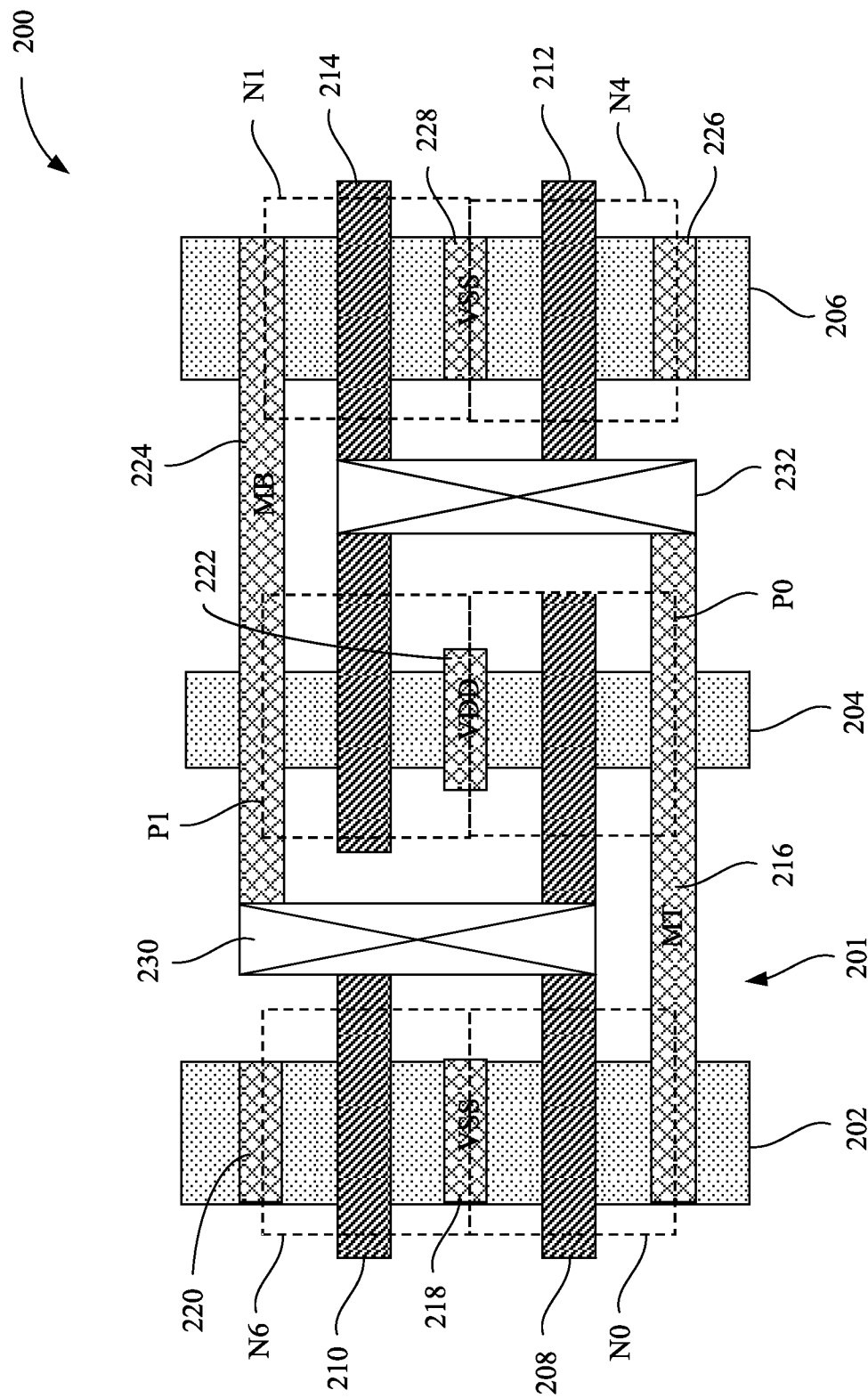
FIG. 2 is a portion of a layout diagram of the memory cell in FIG. 1 in accordance with one or more embodiments.

FIG. 2 is a portion of a layout diagram 200 of the memory cell in FIG. 1 in accordance with one or more embodiments. Layout diagram 200 includes isolation region 201 and oxide-definition (OD) regions 202, 204 and 206. The OD region refers to the active area. Layout diagram 200 further includes polysilicon structures 208, 210, 212, and 214, first interconnection structures 216, 218, 220, 224, 226, and 228, and second interconnection structures 230 and 232. A person having ordinary skill in the art would appreciate that one or more of the layout patterns described herein is usable to prepare a set of masks, that are in turn usable for manufacturing a memory cell in an integrated circuit. The layout diagram 200 of memory cell 100 is a basis to be modified to form other layout structures, such as those described herein, e.g., FIGS. 3, 4, 5B-5D, 6B-6D, 7B, 8 and 9.

An isolation region 201 is located outside at least the area defined by the OD regions 202, 204 and 206. The isolation region 201 surrounding at least the OD regions 202, 204 and 206. In some embodiments, the OD regions 202, 204 and 206 and the isolation region 201 are non-overlapping in space. In some embodiments, each of the OD regions 202, 204 and 206 independently define a P-type transistor area or an N-type transistor area.

First interconnection structures 216, 218, 220, 224, 226, and 228 correspond to interconnection structures of a common layer. Second interconnection structures 230 and 232 correspond to interconnection structures of another common layer.

First interconnection structure 216, polysilicon structure 208, OD region 202, and first interconnection structure 218 define NMOS transistor N0 (as shown in FIG. 1). Polysilicon structure 208 corresponds to the gate of NMOS transistor N0, first interconnection structure 218 corresponds to ground reference node VSS, and first interconnection structure 216 corresponds to reference node MT. The gate of NMOS transistor N0 and PMOS transistor P0 are directly connected by polysilicon structure 208.

First interconnection structure 218, polysilicon structure 210, OD region 202, and first interconnection structure 220 define NMOS transistor N6 (as shown in FIG. 1). Polysilicon structure 210 corresponds to the gate of NMOS transistor N6, first interconnection structure 218 corresponds to ground reference node VSS, and first interconnection structure 220 corresponds to the drain of NMOS transistor N6. The source of each NMOS transistor N0, N6 shares OD region 202. The gate of NMOS transistor N6 is separated from that of PMOS transistor P1.

First interconnection structure 216, polysilicon structure 208, OD region 204, and first interconnection structure 222 define PMOS transistor P0 (as shown in FIG. 1). Polysilicon structure 208 corresponds to the gate of PMOS transistor P0, first interconnection structure 222 corresponds to power supply voltage VDD terminal, and first interconnection structure 216 corresponds to reference node MT. The drain of PMOS transistor P0 and the drain of NMOS transistor N0 are connected by first interconnection structure 216. The source of each PMOS transistor P0, P1 shares OD region 204.

First interconnection structure 224, polysilicon structure 214, OD region 204, and first interconnection structure 222 define PMOS transistor P1 (as shown in FIG. 1). Polysilicon structure 214 corresponds to the gate of PMOS transistor P1, first interconnection structure 222 corresponds to power supply voltage VDD terminal, and first interconnection structure 224 corresponds to reference node MB. The gate of PMOS transistor P1 and NMOS transistor N1 are directly connected by polysilicon structure 214.

First interconnection structure 226, polysilicon structure 212, OD region 206, and first interconnection structure 228 define NMOS transistor N4 (as shown in FIG. 1). Polysilicon structure 212 corresponds to the gate of NMOS transistor N4, first interconnection structure 228 corresponds to ground reference node VSS, and first interconnection structure 226 corresponds to the drain of NMOS transistor N4. The gate of NMOS transistor N4 is separated from that of PMOS transistor P0.

First interconnection structure 224, polysilicon structure 214, OD region 206, and first interconnection structure 228 define NMOS transistor N1 (as shown in FIG. 1). Polysilicon structure 214 corresponds to the gate of NMOS transistor N1, first interconnection structure 228 corresponds to ground reference node VSS, and first interconnection structure 224 corresponds to reference node MB. The drain of PMOS transistor P1 and the drain of NMOS transistor N1 are connected by first interconnection structure 224. The source of each NMOS transistor N1, N4 shares OD region 206.

Second interconnection structure 230 connects the drain of NMOS transistor N1, the drain of PMOS transistor P1, the gate of NMOS transistor N6, the gate of NMOS transistor N0 and the gate of PMOS transistor P0.

Second interconnection structure 232 connects the drain of PMOS transistor P0, the drain of NMOS transistor N0, the gate of NMOS transistor N4, the gate of NMOS transistor N1 and the gate of PMOS transistor P1.

Figure 3:
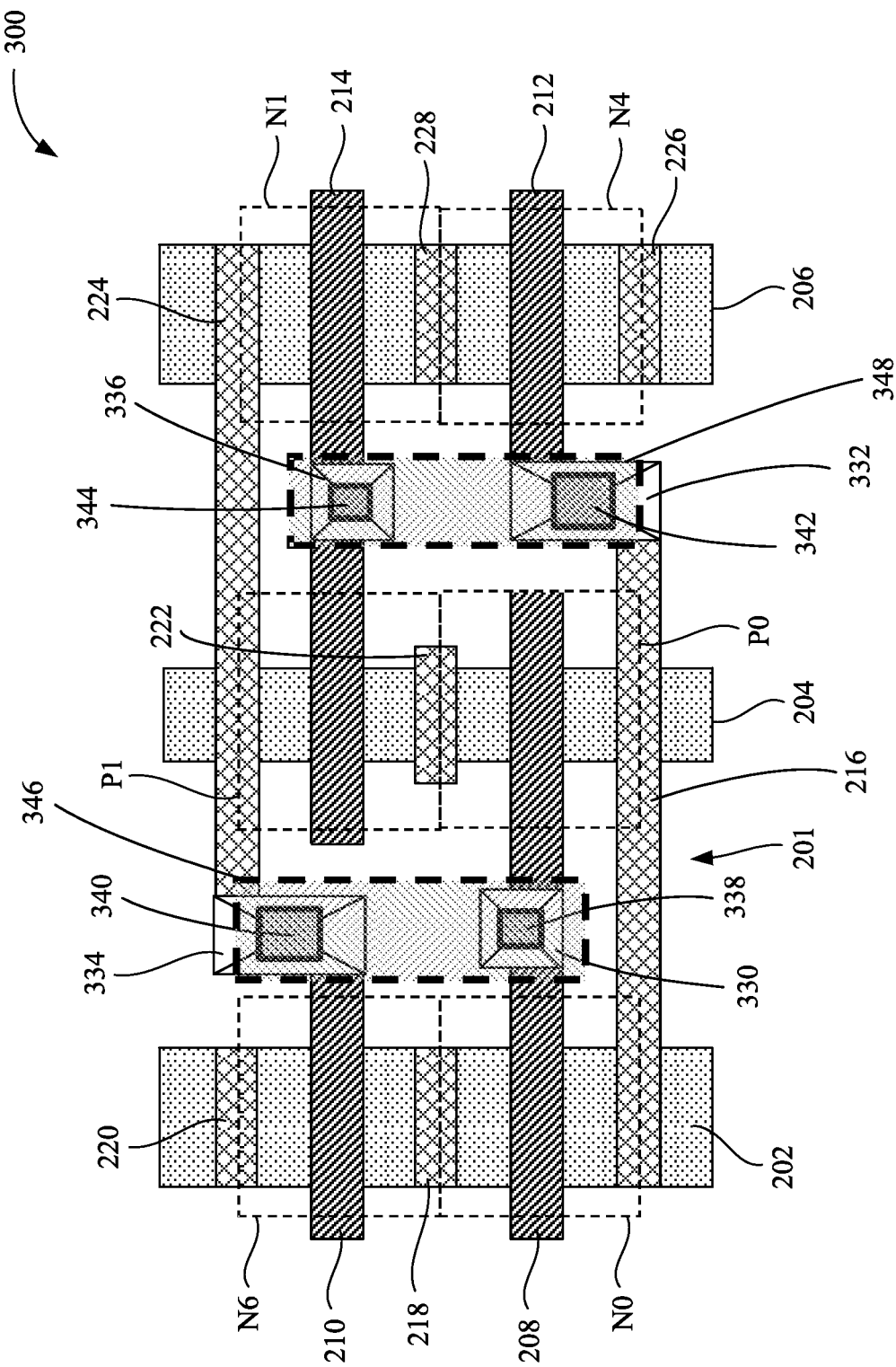
FIG. 3 is a portion of a layout diagram of the memory cell in FIG. 1 in accordance with one or more embodiments.

FIG. 3 is a portion of a layout diagram 300 of the memory cell in FIG. 1 in accordance with one or more embodiments. Layout diagram 300 is an embodiment of layout diagram 200 (shown in FIG. 2) with similar elements. As shown in FIG. 3, similar elements have a same reference number as shown in FIG. 2. In comparison with layout diagram 200 (shown in FIG. 2), layout diagram 300 also includes second interconnection structures 330, 332, 334, and 336, conductive lines 338, 340, 342, and 344, and metal structures 346 and 348. Second interconnection structures 330 and 332 are an embodiment of second interconnection structure 230 shown in FIG. 2. Second interconnection structures 334 and 336 are an embodiment of second interconnection structure 232 shown in FIG. 2. Although not shown with the architecture of layout diagram 300, the architecture of FIG. 3 is sufficient to make each of the structures independently shown in layout diagram 400 of FIG. 4, layout diagram 500B of FIG. 5B, layout diagram 600B of FIG. 6B, layout diagram 700B of FIG. 7B and the like.

Second interconnection structure 330 is electrically connected to at least the gate of NMOS transistor N0 and the gate of PMOS transistor P0. In some embodiments, the second interconnection structure 330 is not utilized to electrically connect the gate of NMOS transistor N0 and the gate of PMOS transistor P0; for example, a first interconnection structure (not shown) is utilized to electrically connect the gate of NMOS transistor N0 and the gate of PMOS transistor P0. Second interconnection structure 330 is electrically connected to at least the gate of NMOS transistor N0 and the gate of PMOS transistor P0. In some embodiments, the second interconnection structure 330 is not utilized to electrically connect the gate of NMOS transistor N0 and the gate of PMOS transistor P0; for example, a conductive line (not shown) and a metal structure (not shown) are utilized to electrically connect the gate of NMOS transistor N0 and the gate of PMOS transistor P0.

Second interconnection structure 332 electrically connects the drain of NMOS transistor N0 and the drain of PMOS transistor P0 to the gate of NMOS transistor N4. In some embodiments, the second interconnection structure 332 is not utilized to electrically connect the drain of NMOS transistor N0 and the drain of PMOS transistor P0 to the gate of NMOS transistor N4; for example, a first interconnection structure (not shown) is utilized to electrically connect the drain of NMOS transistor N0 and the drain of PMOS transistor P0 to the gate of NMOS transistor N4. In some embodiments, the second interconnection structure 332 is not utilized to electrically connect the drain of NMOS transistor N0 and the drain of PMOS transistor P0 to the gate of NMOS transistor N4; for example, a conductive line (not shown) and a metal structure (not shown) are utilized to electrically connect the drain of NMOS transistor N0 and the drain of PMOS transistor P0 to the gate of NMOS transistor N4.

Second interconnection structure 334 electrically connects the drain of NMOS transistor N1 and the drain of PMOS transistor P1 to the gate of NMOS transistor N6. In some embodiments, the second interconnection structure 334 is not utilized to electrically connect the drain of NMOS transistor N1 and the drain of PMOS transistor P1 to the gate of NMOS transistor N6; for example, a first interconnection structure (not shown) is utilized to electrically connect the drain of NMOS transistor N1 and the drain of PMOS transistor P1 to the gate of NMOS transistor N6. In some embodiments, the second interconnection structure 334 is not utilized to electrically connect the drain of NMOS transistor N1 and the drain of PMOS transistor P1 to the gate of NMOS transistor N6; for example, a conductive line (not shown) and a metal structure (not shown) are utilized to electrically connect the drain of NMOS transistor N1 and the drain of PMOS transistor P1 to the gate of NMOS transistor N6.

Second interconnection structure 336 is electrically connected to at least the gate of NMOS transistor N1 and the gate of PMOS transistor P1. In some embodiments, the second interconnection structure 336 is not utilized to electrically connect the gate of NMOS transistor N1 and the gate of PMOS transistor P1; for example, a first interconnection structure (not shown) is utilized to electrically connect the gate of NMOS transistor N1 and the gate of PMOS transistor P1. Second interconnection structure 336 is electrically connected to at least the gate of NMOS transistor N1 and the gate of PMOS transistor P1. In some embodiments, the second interconnection structure 336 is not utilized to electrically connect the gate of NMOS transistor N1 and the gate of PMOS transistor P1; for example, a conductive line (not shown) and a metal structure (not shown) are utilized to electrically connect the gate of NMOS transistor N1 and the gate of PMOS transistor P1.

Conductive line 338 is configured to provide an electrical connection between second interconnection structure 330 and metal structure 346. In some embodiments, second interconnection structure 330 and metal structure 346 are on different layers of memory cell 100. In some embodiments, conductive line 338 is a metal line, a via, a through silicon via (TSV), an inter-level via (ILV), or another suitable conductive line. In some embodiments, conductive line 338 includes copper, aluminum, nickel, titanium, tungsten or another suitable conductive material. In some embodiments, conductive line 338 includes one or more conductive line portions.

Conductive line 340 is configured to provide an electrical connection between second interconnection structure 334 and metal structure 346. In some embodiments, second interconnection structure 334 and metal structure 346 are on different layers of memory cell 100. In some embodiments, conductive line 340 is a metal line, a via, a TSV, an ILV, or another suitable conductive line. In some embodiments, conductive line 340 includes copper, aluminum, nickel, titanium, tungsten or another suitable conductive material. In some embodiments, conductive line 340 includes one or more conductive line portions.

Conductive line 342 is configured to provide an electrical connection between second interconnection structure 332 and metal structure 348. In some embodiments, second interconnection structure 332 and metal structure 348 are on different layers of memory cell 100. In some embodiments, conductive line 342 is a metal line, a via, a TSV, an ILV, or another suitable conductive line. In some embodiments, conductive line 342 includes copper, aluminum, nickel, titanium, tungsten or another suitable conductive material. In some embodiments, conductive line 342 includes one or more conductive line portions.

Conductive line 344 is configured to provide an electrical connection between second interconnection structure 336 and metal structure 348. In some embodiments, second interconnection structure 336 and metal structure 348 are on different layers of memory cell 100. In some embodiments, conductive line 338 is a metal line, a via, a TSV, an ILV, or another suitable conductive line. In some embodiments, conductive line 344 includes copper, aluminum, nickel, titanium, tungsten or another suitable conductive material. In some embodiments, conductive line 344 includes one or more conductive line portions.

Metal structure 346 is configured to electrically connect the drain of NMOS transistor N1, the drain of PMOS transistor P1, the gate of NMOS transistor N6, the gate of NMOS transistor N0 and the gate of PMOS transistor P0. In some embodiments, metal structure 346 is a conductive material including copper, aluminum, alloys thereof or other suitable conductive materials.

Metal structure 348 is configured to electrically connect the drain of NMOS transistor N0, the drain of PMOS transistor P0, the gate of NMOS transistor N4, the gate of NMOS transistor N1 and the gate of PMOS transistor P1. In some embodiments, metal structure 348 is a conductive material including copper, aluminum, alloys thereof or other suitable conductive materials. In some embodiments, metal structure 346 or metal structure 348 is on a different layer from the other components in memory cell 100.

Figure 4:
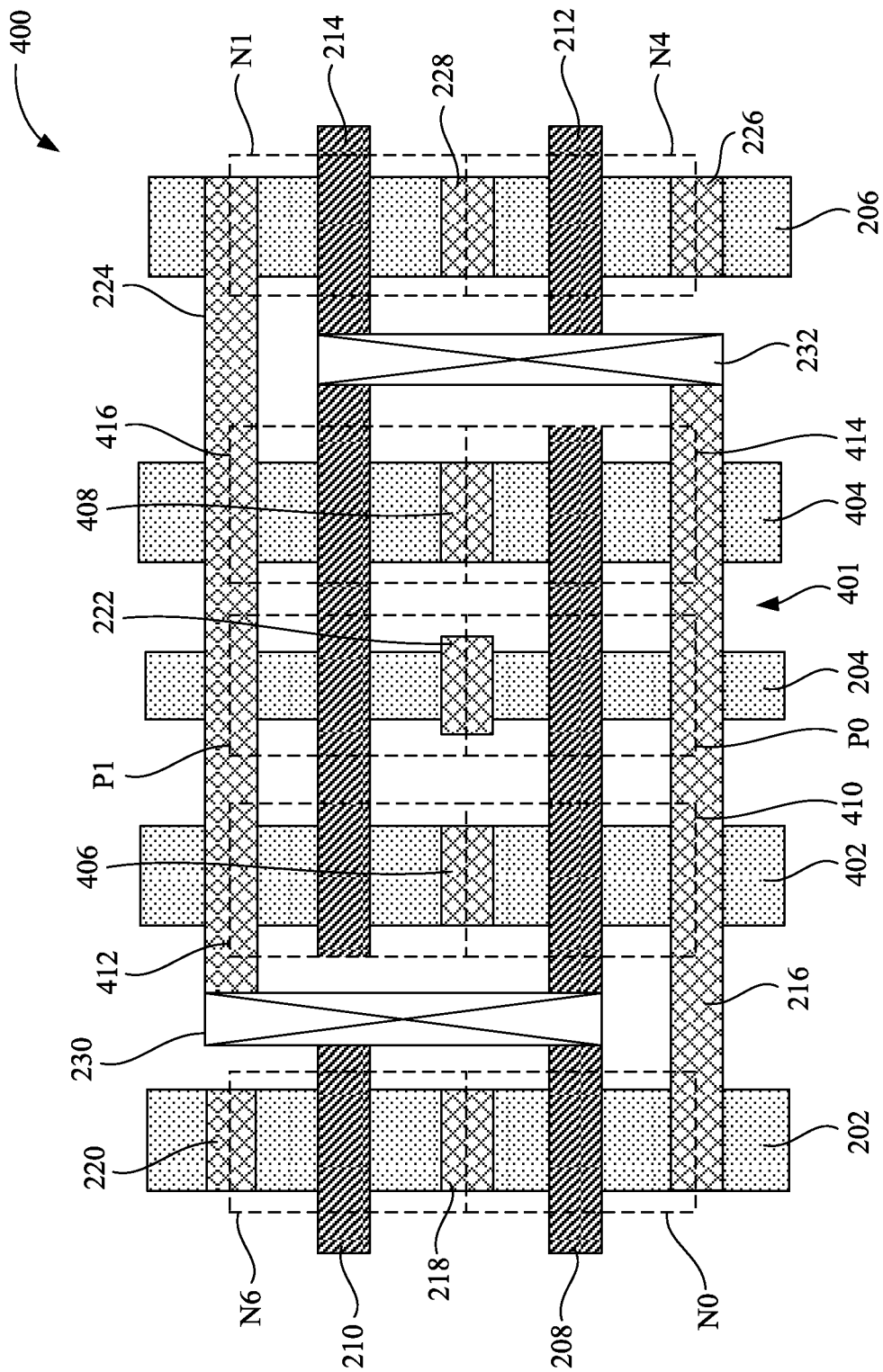
FIG. 4 is a portion of a layout diagram of the memory cell in FIG. 1 in accordance with one or more embodiments.

FIG. 4 is a portion of a layout diagram 400 of the memory cell in FIG. 1 in accordance with one or more embodiments. Layout diagram 400 is an embodiment of layout diagram 200 (shown in FIG. 2) with similar elements. As shown in FIG. 4, similar elements have a same reference number as shown in FIG. 2. In comparison with layout diagram 200 (shown in FIG. 2), layout diagram 400 also includes OD regions 402 and 404, first interconnection structures 406 and 408, and transistors 410, 412, 414 and 416. The OD region refers to the active area. Layout diagram 400 illustrates the layout of a memory cell with 10 transistors (e.g., NMOS transistors N0, N1, N4 and N6, PMOS transistors P0 and P1, and transistors 410, 412, 414 and 416). The layout diagram 400 of memory cell 400 is a basis to be modified to form other layout structures, such as those described herein, e.g., FIGS. 7B, 8 and 9.

In comparison with layout diagram 200 (shown in FIG. 2), OD region 402 is positioned between OD regions 202 and 204. In comparison with layout diagram 200 (shown in FIG. 2), OD region 404 is positioned between OD regions 204 and 206.

An isolation region 401 is outside at least the area defined by the OD regions 202, 204 206, 402 and 404. In some embodiments, the OD regions 202, 204 206, 402 and 404 and the isolation region 401 are non-overlapping in space. In some embodiments, each of the OD regions 202, 204, 206, 402 and 404 independently define a P-type transistor area or an N-type transistor area.

First interconnection structures 406 and 408 correspond to interconnection structures of a common layer.

First interconnection structure 216, polysilicon structure 208, OD region 402, and first interconnection structure 406 define transistor 410. Polysilicon structure 208 corresponds to the gate of transistor 410. First interconnection structure 216 corresponds to either the source or drain of transistor 410. First interconnection structure 406 corresponds to either the source or drain of transistor 410.

First interconnection structure 224, polysilicon structure 214, OD region 402, and first interconnection structure 406 define transistor 412. Polysilicon structure 214 corresponds to the gate of transistor 412. First interconnection structure 224 corresponds to either the source or drain of transistor 412. First interconnection structure 406 corresponds to either the source or drain of transistor 412.

First interconnection structure 216, polysilicon structure 208, OD region 404, and first interconnection structure 408 define transistor 414. Polysilicon structure 208 corresponds to the gate of transistor 414. First interconnection structure 216 corresponds to either the source or drain of transistor 414. First interconnection structure 408 corresponds to either the source or drain of transistor 414.

First interconnection structure 224, polysilicon structure 214, OD region 404, and first interconnection structure 408 define transistor 416. Polysilicon structure 214 corresponds to the gate of transistor 416. First interconnection structure 224 corresponds to either the source or drain of transistor 416. First interconnection structure 408 corresponds to either the source or drain of transistor 416.

Figure 5A:
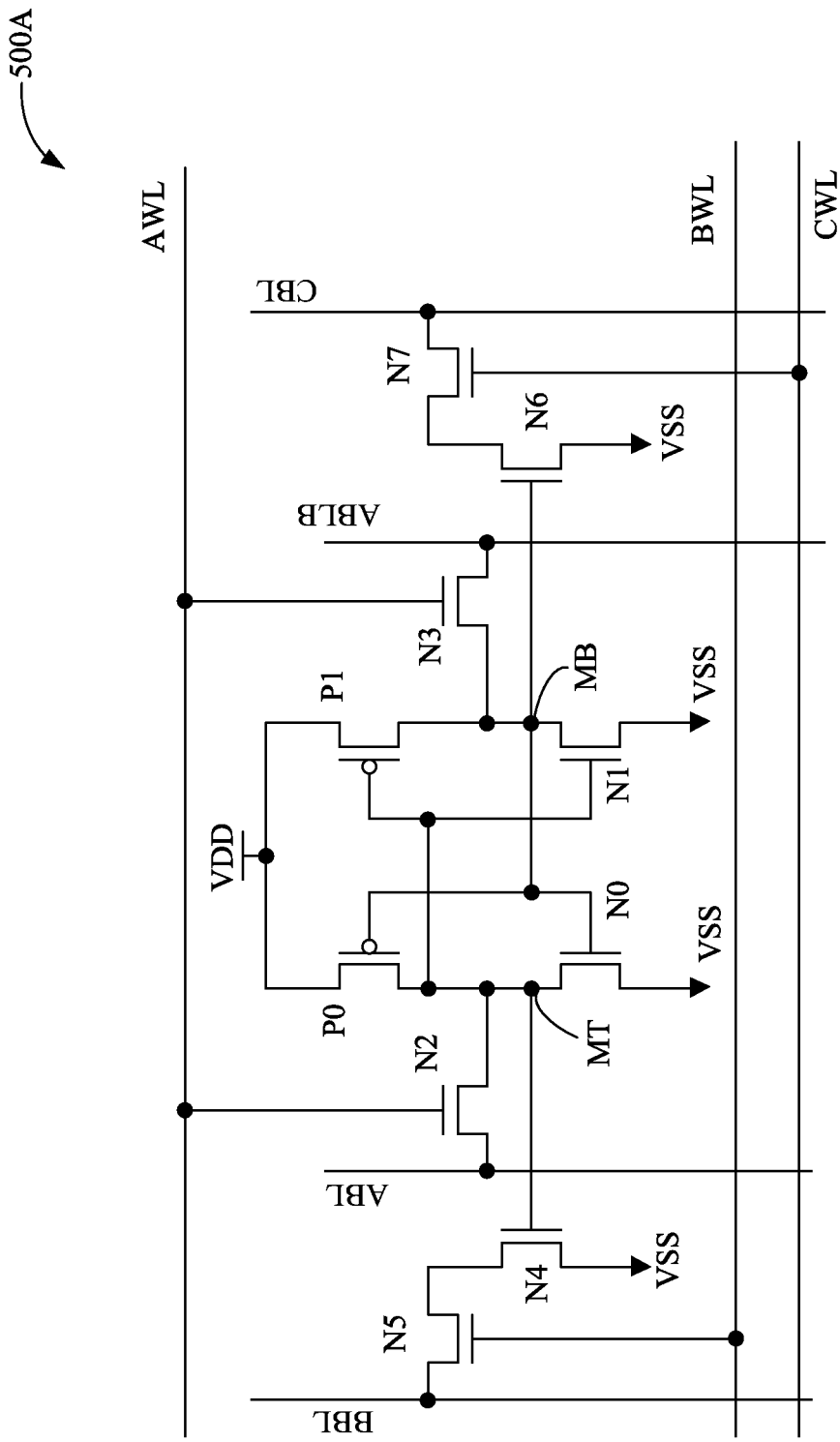
FIG. 5A is a schematic diagram of a portion of a memory cell in accordance with one or more embodiments.

FIG. 5A is a schematic diagram of a portion of a memory cell 500A in accordance with one or more embodiments. Memory cell 500A is an embodiment of the memory cell 100 (shown in FIG. 1) with similar elements. As shown in FIG. 5A, similar elements have a same reference number as shown in FIG. 1. In comparison with memory cell 100 (shown in FIG. 1), memory cell 500A also includes NMOS transistors N2, N3, N5 and N7. In some embodiments, memory cell 500A is a portion of one or more three port (3P) single-end SRAM cells. In some embodiments, write ports or read ports are used. In some embodiments, additional write ports and/or read ports are used. In some embodiments, memory cell 500A employs a number of transistors other than ten. In some embodiments, memory cell 500A is usable in a memory cell array. In some embodiments, memory cell 500A includes three-dimensional gate structures, e.g., fin field-effect-transistors (FinFET). In some embodiments, memory cell 500A is a portion of a 3-Dimensional (3D) structure enabling ultra-high density integration at the individual transistor-level. In a 3D IC, each of the device layers is fabricated sequentially and is stacked upon the preceding layer.

NMOS transistor N2 is configured to selectively connect cross-coupled inverters 102 and 104 to a first bit line ABL. In some embodiments, NMOS transistor N2 is connected between first bit line ABL and reference node MT. The gate of NMOS transistor N2 is connected to the first word line AWL. Both NMOS transistor N2 and NMOS transistor N3 are configured to be activated based on a signal supplied by a first word line AWL.

NMOS transistor N3 is configured to selectively connect cross-coupled inverters 102 and 104 to a first bit line bar ABLB. In some embodiments, NMOS transistor N3 is connected between first bit line bar ABLB and reference node MB. The gate of NMOS transistor N3 is connected to the first word line AWL.

NMOS transistor N5 is coupled between second bit line BBL and the drain of NMOS transistor N4. Second word line BWL is coupled with a gate of NMOS transistor N5. NMOS transistor N5 functions as a pass gate controlled by second word line BWL. In some embodiments, second word line BWL is a read word line.

NMOS transistor N7 is coupled between third bit line CBL and the drain of NMOS transistor N6. Third word line CWL is coupled with a gate of NMOS transistor N7. NMOS transistor N7 functions as a pass gate controlled by third word line CWL. In some embodiments, third word line CWL is a read word line.

Figure 5B:
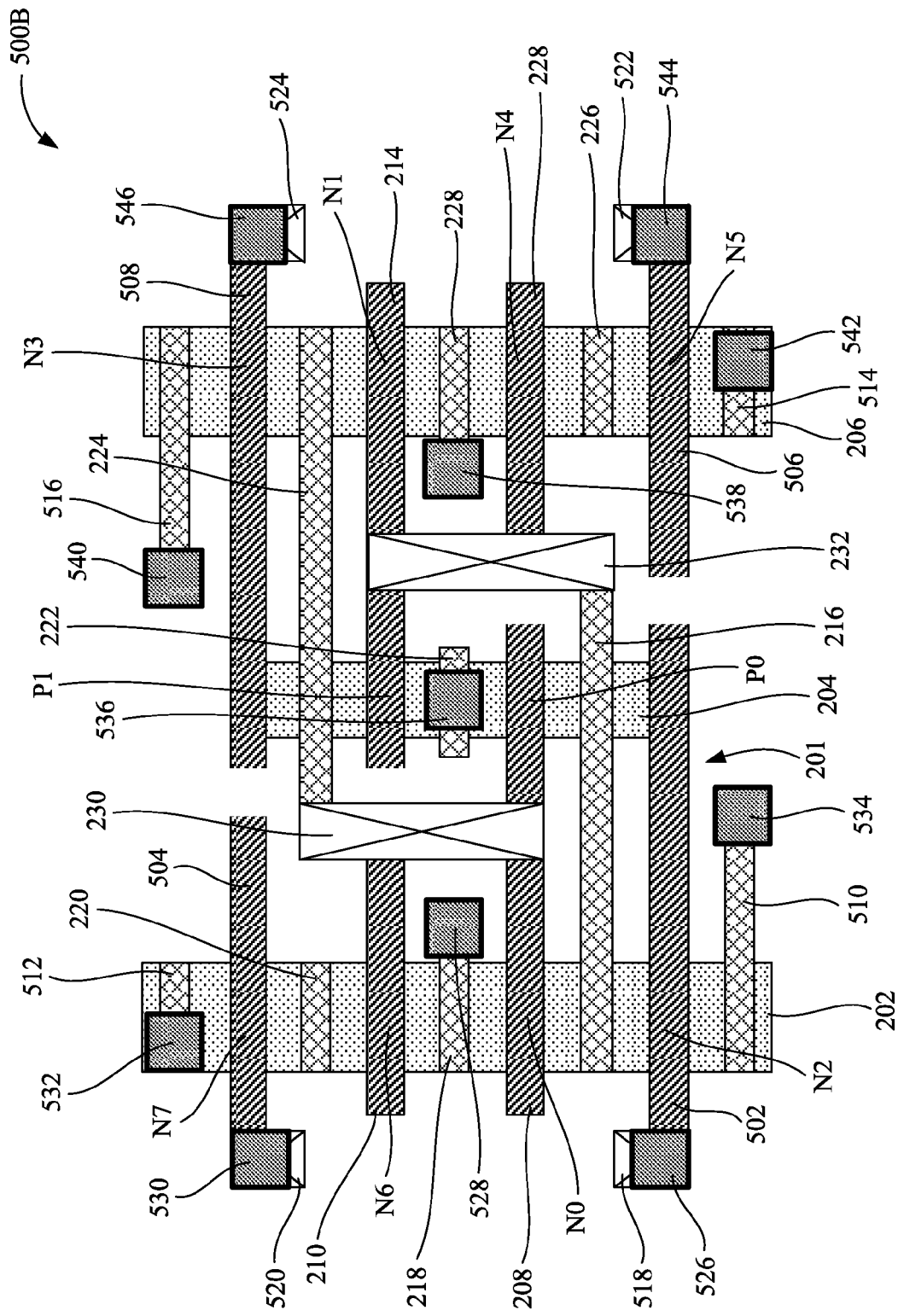
FIG. 5B is a portion of a layout diagram of the memory cell in FIG. 5A in accordance with one or more embodiments.

FIG. 5B is a portion of a layout diagram 500B of the memory cell in FIG. 5A in accordance with one or more embodiments. Layout diagram 500B is an embodiment of layout diagram 200 (shown in FIG. 2) with similar elements. As shown in FIG. 5B, similar elements have a same reference number as shown in FIG. 2. In comparison with layout diagram 200 (shown in FIG. 2), layout diagram 500B also includes polysilicon structures 502, 504, 506 and 508, first interconnection structures 510, 512, 514, and 516, second interconnection structures 518, 520, 522, and 524, and first conductive lines 526, 528, 530, 532, 534, 536, 538, 540, 542, 544 and 546.

First interconnection structures 510, 512, 514, and 516 correspond to interconnection structures of a common layer. Second interconnection structures 518, 520, 522, and 524 correspond to interconnection structures of another common layer.

First interconnection structure 510, polysilicon structure 502, OD region 202, and first interconnection structure 216 define NMOS transistor N2 (as shown in FIG. 5A). Polysilicon structure 502 corresponds to the gate of NMOS transistor N2, first interconnection structure 510 corresponds to the source of NMOS transistor N2, and first interconnection structure 216 corresponds to reference node MT.

First interconnection structure 220, polysilicon structure 504, OD region 202, and first interconnection structure 512 define NMOS transistor N7 (as shown in FIG. 5A). Polysilicon structure 504 corresponds to the gate of NMOS transistor N7, first interconnection structure 512 corresponds to the source of NMOS transistor N7, and first interconnection structure 220 corresponds to the drain of NMOS transistor N7.

First interconnection structure 226, polysilicon structure 506, OD region 206, and first interconnection structure 514 define NMOS transistor N5 (as shown in FIG. 5A). Polysilicon structure 506 corresponds to the gate of NMOS transistor N5, first interconnection structure 514 corresponds to the source of NMOS transistor N5, and first interconnection structure 226 corresponds to the drain of NMOS transistor N5.

First interconnection structure 516, polysilicon structure 508, OD region 206, and first interconnection structure 224 define NMOS transistor N3 (as shown in FIG. 5A). Polysilicon structure 508 corresponds to the gate of NMOS transistor N3, first interconnection structure 516 corresponds to the source of NMOS transistor N3, and first interconnection structure 224 corresponds to reference node MB.

Second interconnection structure 518 is electrically connected to at least the gate of NMOS transistor N2 and conductive line 526.

Second interconnection structure 520 is electrically connected to at least the gate of NMOS transistor N7 and conductive line 530.

Second interconnection structure 522 is electrically connected to at least the gate of NMOS transistor N5 and conductive line 544.

Second interconnection structure 524 is electrically connected to at least the gate of NMOS transistor N3 and conductive line 546.

Figure 5C:
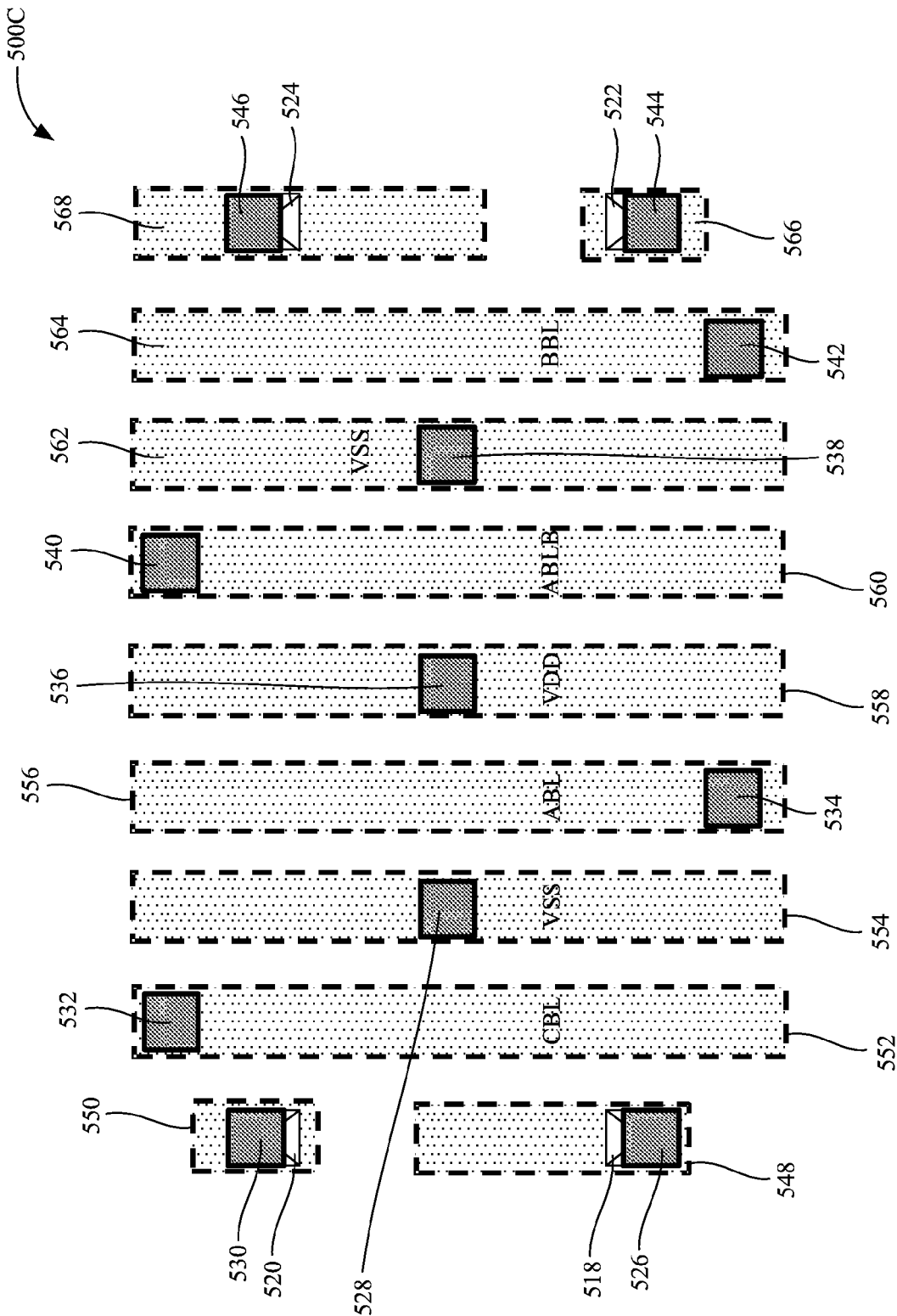
FIG. 5C is a portion of a layout diagram of the memory cell in FIG. 5A in accordance with one or more embodiments.

First conductive line 526 is configured to provide an electrical connection between second interconnection structure 518 and first metal structure 548 (shown in FIG. 5C). In some embodiments, second interconnection structure 518 and first metal structure 548 are on different layers of memory cell 500A.

First conductive line 528 is configured to provide an electrical connection between first interconnecting region 218 and first metal structure 554 (shown in FIG. 5C). In some embodiments, first interconnecting region 218 and first metal structure 554 are on different layers of memory cell 500A.

First conductive line 530 is configured to provide an electrical connection between second interconnection structure 518 and first metal structure 550 (shown in FIG. 5C). In some embodiments, second interconnection structure 518 and first metal structure 550 are on different layers of memory cell 500A.

First conductive line 532 is configured to provide an electrical connection between first interconnecting region 512 and first metal structure 532 (shown in FIG. 5C). In some embodiments, first interconnecting region 512 and first metal structure 532 are on different layers of memory cell 500A.

First conductive line 534 is configured to provide an electrical connection between first interconnecting region 510 and first metal structure 556 (shown in FIG. 5C). In some embodiments, first interconnecting region 510 and first metal structure 556 are on different layers of memory cell 500A.

First conductive line 536 is configured to provide an electrical connection between first interconnecting region 222 and first metal structure 558 (shown in FIG. 5C). In some embodiments, first interconnecting region 222 and first metal structure 558 are on different layers of memory cell 500A.

First conductive line 538 is configured to provide an electrical connection between first interconnecting region 228 and first metal structure 562 (shown in FIG. 5C). In some embodiments, first interconnecting region 228 and first metal structure 562 are on different layers of memory cell 500A.

First conductive line 540 is configured to provide an electrical connection between first interconnecting region 516 and first metal structure 560 (shown in FIG. 5C). In some embodiments, first interconnecting region 516 and first metal structure 560 are on different layers of memory cell 500A.

First conductive line 542 is configured to provide an electrical connection between first interconnecting region 514 and first metal structure 564 (shown in FIG. 5C). In some embodiments, first interconnecting region 514 and first metal structure 564 are on different layers of memory cell 500A.

First conductive line 544 is configured to provide an electrical connection between second interconnection structure 522 and first metal structure 566 (shown in FIG. 5C). In some embodiments, second interconnection structure 522 and first metal structure 566 are on different layers of memory cell 500A.

First conductive line 546 is configured to provide an electrical connection between second interconnection structure 524 and first metal structure 568 (shown in FIG. 5C). In some embodiments, second interconnection structure 524 and first metal structure 568 are on different layers of memory cell 500A.

In some embodiments, each of the first conductive lines 526, 528, 530, 532, 534, 536, 538, 540, 542, 544 and 546 independently is a metal line, a via, a TSV, an ILV, or another suitable conductive line. In some embodiments, each of the first conductive lines 526, 528, 530, 532, 534, 536, 538, 540, 542, 544 and 546 independently includes copper, aluminum, nickel, titanium, tungsten or another suitable conductive material. In some embodiments, each of the first conductive lines 526, 528, 530, 532, 534, 536, 538, 540, 542, 544 and 546 independently includes one or more conductive line portions.

FIG. 5C is a portion of a layout diagram 500C of the memory cell in FIG. 5A in accordance with one or more embodiments. Layout diagram 500C is an embodiment of layout diagram 500B (shown in FIG. 5B) with similar elements. As shown in FIG. 5C, similar elements have a same reference number as shown in FIG. 5B. In comparison with layout diagram 500B (shown in FIG. 5B), layout diagram 500C also includes first metal structures 548, 550, 552, 554, 556, 558, 560, 562, 564, 566, and 568. In comparison with layout diagram 500B (shown in FIG. 5B), layout diagram 500C does not include each of the elements from FIG. 2, polysilicon structures 502, 504, 506 and 508, and first interconnection structures 510, 512, 514, and 516 (for illustrative purposes).

Figure 5D:
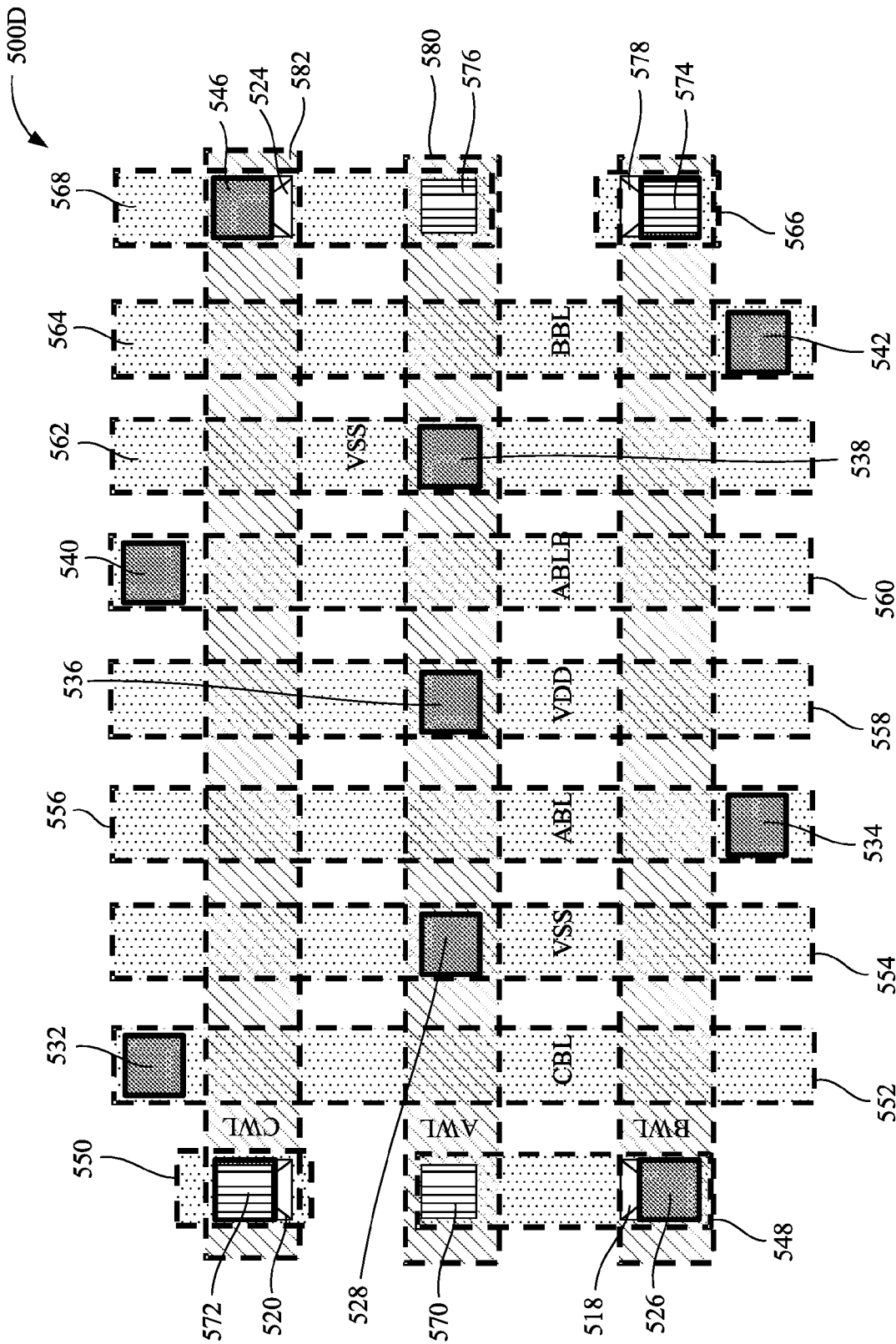
FIG. 5D is a portion of a layout diagram of the memory cell in FIG. 5A in accordance with one or more embodiments.

First metal structure 548 is configured to electrically connect the gate of NMOS transistor N2 to the second metal layer 578 (shown in FIG. 5D). In some embodiments, first metal structure 548 is a conductive material including copper, aluminum, alloys thereof or other suitable conductive materials.

First metal structure 550 is configured to electrically connect the gate of NMOS transistor N7 to the second metal layer 582 (shown in FIG. 5D). In some embodiments, first metal structure 550 is a conductive material including copper, aluminum, alloys thereof or other suitable conductive materials.

First metal structure 552 is configured to electrically connect the source of NMOS transistor N7 to the third bit line CBL. In some embodiments, first metal structure 552 is a conductive material including copper, aluminum, alloys thereof or other suitable conductive materials.

First metal structure 554 is configured to electrically connect the source of NMOS transistors N0 and N6 to the ground reference node VSS. In some embodiments, first metal structure 554 is a conductive material including copper, aluminum, alloys thereof or other suitable conductive materials.

First metal structure 556 is configured to electrically connect the source of NMOS transistor N2 to the first bit line ABL. In some embodiments, first metal structure 556 is a conductive material including copper, aluminum, alloys thereof or other suitable conductive materials.

First metal structure 558 is configured to electrically connect the drain of PMOS transistors P0 and P1 to the power supply voltage VDD terminal. In some embodiments, first metal structure 558 is a conductive material including copper, aluminum, alloys thereof or other suitable conductive materials.

First metal structure 560 is configured to electrically connect the source of NMOS transistor N3 to the first bit line bar ABLB. In some embodiments, first metal structure 556 is a conductive material including copper, aluminum, alloys thereof or other suitable conductive materials.

First metal structure 562 is configured to electrically connect the source of NMOS transistors N1 and N4 to the ground reference node VSS. In some embodiments, first metal structure 562 is a conductive material including copper, aluminum, alloys thereof or other suitable conductive materials.

First metal structure 564 is configured to electrically connect the source of NMOS transistor N5 to the second bit line BBL. In some embodiments, first metal structure 564 is a conductive material including copper, aluminum, alloys thereof or other suitable conductive materials.

First metal structure 566 is configured to electrically connect the gate of NMOS transistor N5 to the second metal layer 578 (shown in FIG. 5D). In some embodiments, first metal structure 566 is a conductive material including copper, aluminum, alloys thereof or other suitable conductive materials.

First metal structure 568 is configured to electrically connect the gate of NMOS transistor N3 to the second metal layer 582 (shown in FIG. 5D). In some embodiments, first metal structure 568 is a conductive material including copper, aluminum, alloys thereof or other suitable conductive materials.

In some embodiments, each of first metal structures 548, 550, 552, 554, 556, 558, 560, 562, 564, 566, and 568 independently is formed on a different layer from the other components in memory cell 500A.

FIG. 5D is a portion of a layout diagram 500D of the memory cell in FIG. 5A in accordance with one or more embodiments. Layout diagram 500D is an embodiment of layout diagram 500C (shown in FIG. 5C) with similar elements. As shown in FIG. 5D, similar elements have a same reference number as shown in FIG. 5C. In comparison with layout diagram 500C (shown in FIG. 5B), layout diagram 500D also includes second conductive lines 570, 572, 574 and 576 and second metal structures 578, 580, and 582.

Second conductive line 570 is configured to provide an electrical connection between second metal structure 580 and first metal structure 548. In some embodiments, second metal structure 580 and first metal structure 548 are on different layers of memory cell 500A.

Second conductive line 572 is configured to provide an electrical connection between second metal structure 582 and first metal structure 550. In some embodiments, second metal structure 582 and first metal structure 550 are on different layers of memory cell 500A.

Second conductive line 574 is configured to provide an electrical connection between second metal structure 578 and first metal structure 566. In some embodiments, second metal structure 578 and first metal structure 566 are on different layers of memory cell 500A.

Second conductive line 576 is configured to provide an electrical connection between second metal structure 582 and first metal structure 568. In some embodiments, second metal structure 582 and first metal structure 568 are on different layers of memory cell 500A.

In some embodiments, each of the second conductive lines 570, 572, 574 and 576 independently is a metal line, a via, a TSV, an ILV, or another suitable conductive line. In some embodiments, each of the second conductive lines 570, 572, 574 and 576 independently includes copper, aluminum, nickel, titanium, tungsten or another suitable conductive material. In some embodiments, each of the second conductive lines 570, 572, 574 and 576 independently includes one or more conductive line portions.

Second metal structure 578 is configured to electrically connect the gate of NMOS transistor N5 to the second word line BWL by second interconnecting region 522, first conductive line 544, first metal structure 566 and second conductive line 574.

Second metal structure 580 is configured to electrically connect the gate of NMOS transistor N2 to the first word line AWL by second interconnecting region 518, first conductive line 526, first metal structure 548 and second conductive line 570.

Second metal structure 580 is configured to electrically connect the gate of NMOS transistor N3 to the first word line AWL by second interconnecting region 524, first conductive line 546, first metal structure 568 and second conductive line 576.

Second metal structure 582 is configured to electrically connect the gate of NMOS transistor N7 to the third word line CWL by second interconnecting region 520, first conductive line 530, first metal structure 550 and second conductive line 572.

In some embodiments, each of second metal structures 578, 580 and 582 is a conductive material independently including copper, aluminum, alloys thereof or other suitable conductive materials. In some embodiments, each of second metal structures 578, 580 and 582 independently is on a different layer from the other components in memory cell 500A. In some embodiments, the second metal structure 578 vertically overlaps each of the first metal structures 548, 552, 554, 556, 558, 560, 562, 564 and 566. In some embodiments, the second metal structure 580 vertically overlaps each of the first metal structures 548, 552, 554, 556, 558, 560, 562, 564 and 568. In some embodiments, the second metal structure 582 vertically overlaps each of the first metal structures 550, 552, 554, 556, 558, 560, 562, 564 and 568.

In some embodiments, as shown in FIGS. 5A-5D, the cell width and the area occupied by layout 500B, 500C and 500D of memory cell 500A are reduced, since the number of metal lines (e.g., first metal structures 548, 550, 552, 554, 556, 558, 560, 562, 564, 566, and 568) are reduced when compared with other three-port single-end memory cell layouts.

Figure 6A:
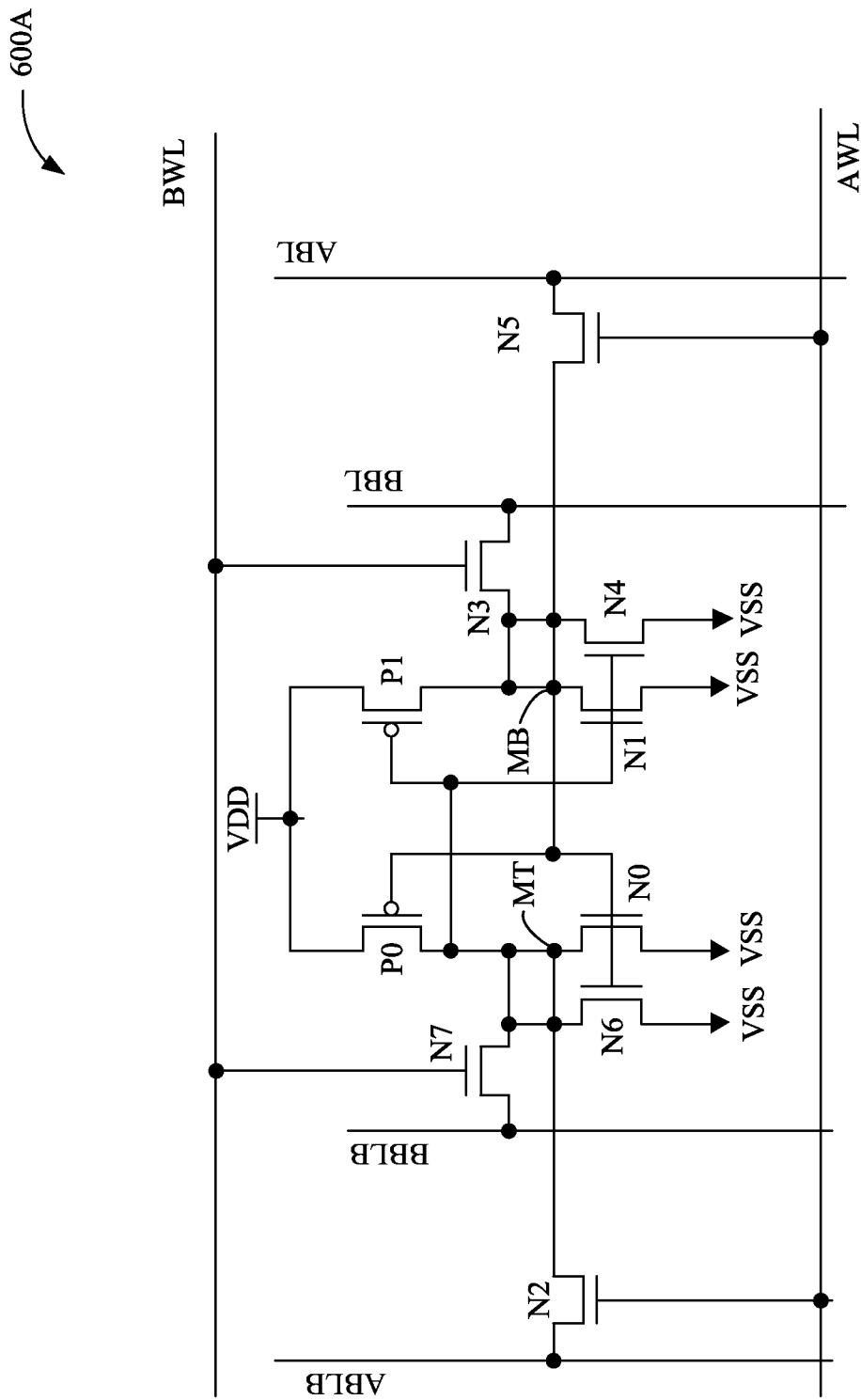
FIG. 6A is a schematic diagram of a portion of a memory cell in accordance with one or more embodiments.

FIG. 6A is a schematic diagram of a portion of a memory cell 600A in accordance with one or more embodiments. Memory cell 600A is an embodiment of the memory cell 100 (shown in FIG. 1) with similar elements. As shown in FIG. 6A, similar elements have a same reference number as shown in FIG. 1. In comparison with memory cell 100 (shown in FIG. 1), memory cell 600A also includes NMOS transistors N2, N3, N5 and N7. In some embodiments, memory cell 600A is a portion of one or more two port (2P) SRAM cells. In some embodiments, write ports or read ports are used. In some embodiments, additional write ports and/or read ports are used. In some embodiments, memory cell 600A employs a number of transistors other than ten. In some embodiments, memory cell 600A is usable in a memory cell array. In some embodiments, memory cell 600A includes three-dimensional gate structures, e.g. fin field-effect-transistors (FinFET). In some embodiments, memory cell 600A is a portion of a 3-Dimensional (3D) structure enabling ultra-high density integration at the individual transistor-level. In a 3D IC, each of the device layers is fabricated sequentially and is stacked upon the preceding layer.

In comparison with memory cell 100 (shown in FIG. 1), the NMOS transistors N4 and N6 of memory cell 600A are arranged in a different configuration. NMOS transistor N4 of memory cell 600A is arranged in a parallel configuration with NMOS transistor N1 to increase the driving capability of NMOS transistors N4 and N1. NMOS transistor N6 of memory cell 600A is arranged in a parallel configuration with NMOS transistor N0 to increase the driving capability of NMOS transistors N6 and N0.

NMOS transistor N2 is configured to selectively connect cross-coupled inverters 102 and 104 to a first bit line bar ABLB. In some embodiments, NMOS transistor N2 is connected between first bit line bar ABLB and reference node MT. The gate of NMOS transistor N2 is connected to the first word line AWL. Both NMOS transistor N2 and NMOS transistor N5 are configured to be activated based on a signal supplied by a first word line AWL.

NMOS transistor N3 is configured to selectively connect cross-coupled inverters 102 and 104 to a second bit line BBL. In some embodiments, NMOS transistor N3 is connected between second bit line BBL and reference node MB. The gate of NMOS transistor N3 is connected to the second word line BWL. Both NMOS transistor N3 and NMOS transistor N7 are configured to be activated based on a signal supplied by a second word line BWL.

NMOS transistor N5 is configured to selectively connect cross-coupled inverters 102 and 104 to a first bit line ABL. In some embodiments, NMOS transistor N5 is connected between first bit line ABL and reference node MT. The gate of NMOS transistor N5 is connected to the first word line AWL.

NMOS transistor N7 is configured to selectively connect cross-coupled inverters 102 and 104 to a second bit line bar BBLB. In some embodiments, NMOS transistor N7 is connected between second bit line bar BBLB and reference node MT. The gate of NMOS transistor N7 is connected to the second word line BWL.

Figure 6B:
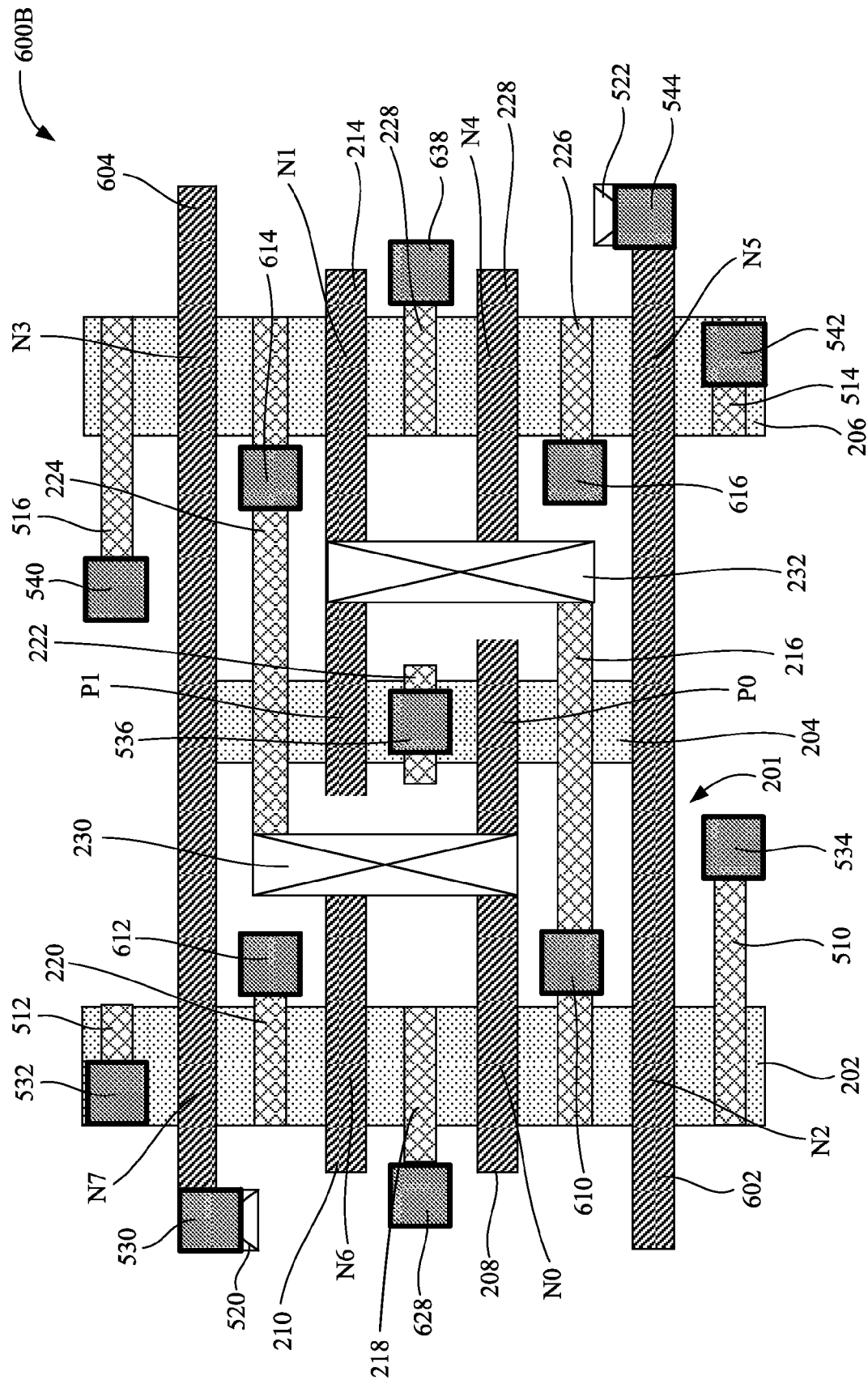
FIG. 6B is a portion of a layout diagram of the memory cell in FIG. 6A in accordance with one or more embodiments.

FIG. 6B is a portion of a layout diagram 600B of the memory cell in FIG. 6A in accordance with one or more embodiments. Layout diagram 600B is an embodiment of layout diagram 500B (shown in FIG. 5B) with similar elements. As shown in FIG. 6B, similar elements have a same reference number as shown in FIG. 5B. In comparison with layout diagram 500B (shown in FIG. 5B), layout diagram 600B also includes polysilicon structures 602 and 604, first conductive lines 610, 612, 614 and 616. In comparison with layout diagram 500B (shown in FIG. 5B), layout diagram 600B does not include polysilicon structures 502, 504, 506 and 508, second interconnection structures 518 and 524 and first conductive lines 526 and 546. Polysilicon structure 602 is an embodiment of polysilicon structures 502 and 506 shown in FIG. 5B. Polysilicon structure 604 is an embodiment of polysilicon structures 504 and 508 shown in FIG. 5B.

Polysilicon structure 602 corresponds to the gates of NMOS transistors N2 and N5. Polysilicon structure 602 extends across the cell width of memory cell 600A. Polysilicon structure 602 directly connects the gates of NMOS transistors N2 and N5.

Polysilicon structure 604 corresponds to the gates of NMOS transistors N3 and N7. Polysilicon structure 604 extends across the cell width of memory cell 600A. Polysilicon structure 604 directly connects the gates of NMOS transistors N3 and N7

Figure 6C:
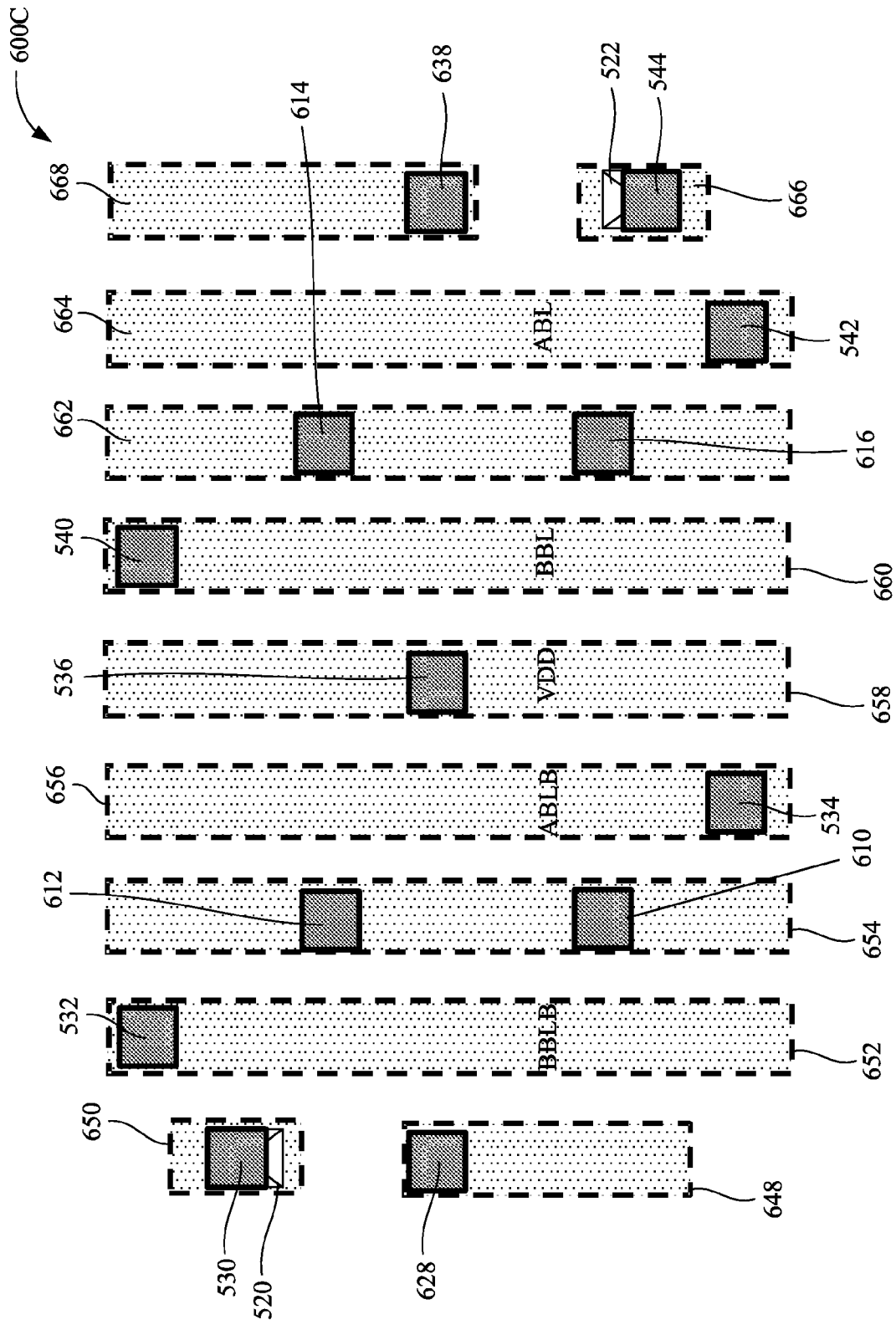
FIG. 6C is a portion of a layout diagram of the memory cell in FIG. 6A in accordance with one or more embodiments.

First conductive line 610 is configured to provide an electrical connection between first interconnecting region 216 and first metal structure 654 (shown in FIG. 6C). In some embodiments, first interconnecting region 216 and first metal structure 654 are on different layers of memory cell 600A.

First conductive line 612 is configured to provide an electrical connection between first interconnecting region 220 and first metal structure 654 (shown in FIG. 6C). In some embodiments, first interconnecting region 220 and first metal structure 654 are on different layers of memory cell 600A.

First conductive line 614 is configured to provide an electrical connection between first interconnecting region 224 and first metal structure 662 (shown in FIG. 6C). In some embodiments, first interconnecting region 224 and first metal structure 662 are on different layers of memory cell 600A.

First conductive line 616 is configured to provide an electrical connection between first interconnecting region 226 and first metal structure 662 (shown in FIG. 6C). In some embodiments, first interconnecting region 226 and first metal structure 662 are on different layers of memory cell 600A.

First conductive line 628 is configured to provide an electrical connection between first interconnecting region 218 and first metal structure 648 (shown in FIG. 6C). In some embodiments, first interconnecting region 218 and first metal structure 648 are on different layers of memory cell 600A. First conductive line 628 is positioned along the edge of the cell width of memory cell 600A.

First conductive line 638 is configured to provide an electrical connection between first interconnecting region 228 and first metal structure 668 (shown in FIG. 6C). In some embodiments, first interconnecting region 228 and first metal structure 668 are on different layers of memory cell 600A. First conductive line 638 is positioned along the edge of the cell width of memory cell 600A.

In some embodiments, each of the first conductive lines 610, 612, 614, 628 and 638 independently is a metal line, a via, a TSV, an ILV, or another suitable conductive line. In some embodiments, each of the first conductive lines 610, 612, 614, 628 and 638 independently includes copper, aluminum, nickel, titanium, tungsten or another suitable conductive material. In some embodiments, each of the first conductive lines 610, 612, 614, 628 and 638 independently includes one or more conductive line portions.

FIG. 6C is a portion of a layout diagram 600C of the memory cell in FIG. 6A in accordance with one or more embodiments. Layout diagram 600C is an embodiment of layout diagram 600B (shown in FIG. 6B) with similar elements. As shown in FIG. 6C, similar elements have a same reference number as shown in FIG. 6B. In comparison with layout diagram 600B (shown in FIG. 6B), layout diagram 600C also includes first metal structures 648, 650, 652, 654, 656, 658, 660, 662, 664, 666 and 668. In comparison with layout diagram 600B (shown in FIG. 6B), layout diagram 600C does not include each of the elements from FIG. 2, polysilicon structures 502, 504, 506, 508, 602 and 604, and first interconnection structures 510, 512, 514, and 516 (for illustrative purposes).

Figure 6D:
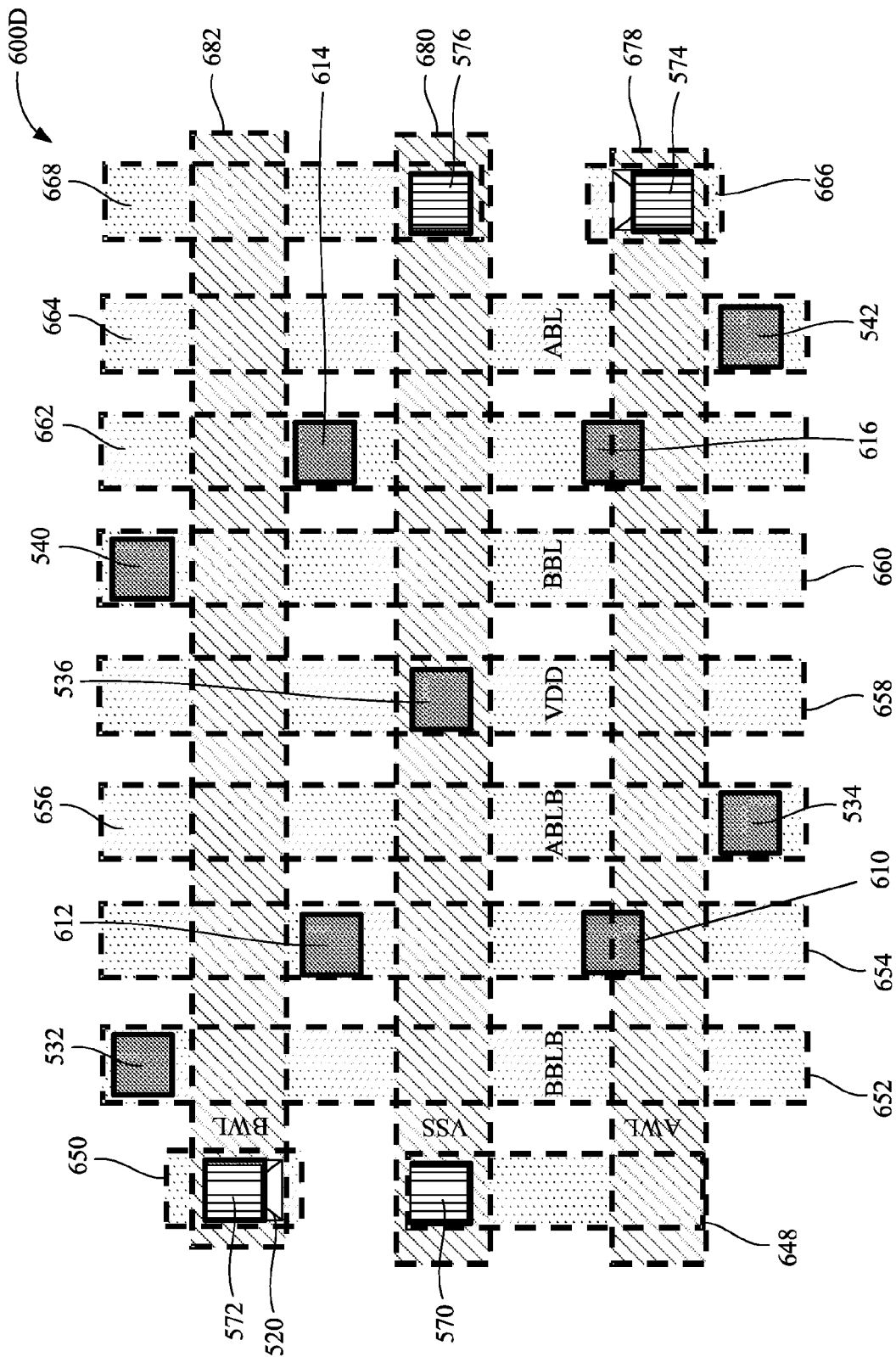
FIG. 6D is a portion of a layout diagram of the memory cell in FIG. 6A in accordance with one or more embodiments.

First metal structure 648 is configured to electrically connect the source of NMOS transistors N0 and N6 (by the first conductive line 628) to the second metal layer 680 (shown in FIG. 6D).

First metal structure 650 is configured to electrically connect the gate of NMOS transistor N7 to the second metal layer 682 (shown in FIG. 6D).

First metal structure 652 is configured to electrically connect the source of NMOS transistor N7 to the second bit line bar BBLB.

First metal structure 654 is configured to electrically connect the drains of NMOS transistors N0 and N6 to each other (by first conductive lines 610 and 612).

First metal structure 656 is configured to electrically connect the source of NMOS transistor N2 to the first bit line bar ABLB.

First metal structure 658 is configured to electrically connect the drain of PMOS transistors P0 and P1 to the power supply voltage VDD terminal.

First metal structure 660 is configured to electrically connect the source of NMOS transistor N3 to the second bit line BBL.

First metal structure 662 is configured to electrically connect the drains of NMOS transistors N1 and N4 to each other (by first conductive lines 614 and 616).

First metal structure 664 is configured to electrically connect the source of NMOS transistor N5 to the first bit line ABL.

First metal structure 666 is configured to electrically connect the gate of NMOS transistor N5 to the second metal layer 678 (shown in FIG. 6D).

First metal structure 668 is configured to electrically connect the source of NMOS transistors N1 and N4 (by the first conductive line 638) to the second metal layer 680 (shown in FIG. 6D).

In some embodiments, the electrodes of NMOS transistors N1 and N4 are symmetrically located in order to reduce the static noise margin (SNM) of the memory cell 600A. In some embodiments, the electrodes of NMOS transistors N0 and N6 are symmetric in order to reduce the static noise margin (SNM) of the memory cell 600A.

In some embodiments, each of first metal structures 648, 650, 652, 654, 656, 658, 660, 662, 664, 666, and 668 independently is a conductive material including copper, aluminum, alloys thereof or other suitable conductive materials. In some embodiments, each of first metal structures 648, 650, 652, 654, 656, 658, 660, 662, 664, 666, and 668 independently is on a different layer from the other components in memory cell 600A.

FIG. 6D is a portion of a layout diagram 600D of the memory cell in FIG. 6A in accordance with one or more embodiments. Layout diagram 600D is an embodiment of layout diagram 600C (shown in FIG. 6C) with similar elements. As shown in FIG. 6D, similar elements have a same reference number as shown in FIG. 6C. In comparison with layout diagram 600C (shown in FIG. 6C), layout diagram 600D also includes second conductive lines 570, 572, 574 and 576 and second metal structures 678, 680, and 682. Layout diagram 600D is an embodiment of layout diagram 500D (shown in FIG. 5D) with similar elements.

Second metal structure 678 is configured to electrically connect the gates of NMOS transistors N5 and N2 to the first word line AWL by second interconnecting region 522, first conductive line 544, first metal structure 666 and second conductive line 574.

Second metal structure 680 is configured to electrically connect the sources of NMOS transistors N1, N4, N6 and N0 to the ground reference node (VSS) by the first conductive lines 628 and 638, the second conductive lines 570 and 576 and first metal structures 648 and 668.

Second metal structure 682 is configured to electrically connect the gates of NMOS transistors N7 and N3 to the second word line BWL by second interconnecting region 520, first conductive line 530, first metal structure 650 and second conductive line 572.

In some embodiments, each of second metal structures 678, 680 and 682 is a conductive material independently including copper, aluminum, alloys thereof or other suitable conductive materials. In some embodiments, each of second metal structures 678, 680 and 682 is on a different layer from the other components in memory cell 600A. In some embodiments, the second metal structure 678 vertically overlaps each of the first metal structures 648, 652, 654, 656, 658, 660, 662, 664 and 666. In some embodiments, the second metal structure 680 vertically overlaps each of the first metal structures 648, 650, 652, 654, 656, 658, 660, 662, 664 and 668. In some embodiments, the second metal structure 682 vertically overlaps each of the first metal structures 650, 652, 654, 656, 658, 660, 662, 664 and 668.

In some embodiments, as shown in FIGS. 6A-6D, the cell width and the area occupied by layout 600B, 600C and 600D of memory cell 600A are reduced since the number of metal lines (e.g., first metal structures 648, 650, 652, 654, 656, 658, 660, 662, 664, 666, and 668) are reduced when compared with other dual-port memory cell layouts.

Figure 7A:
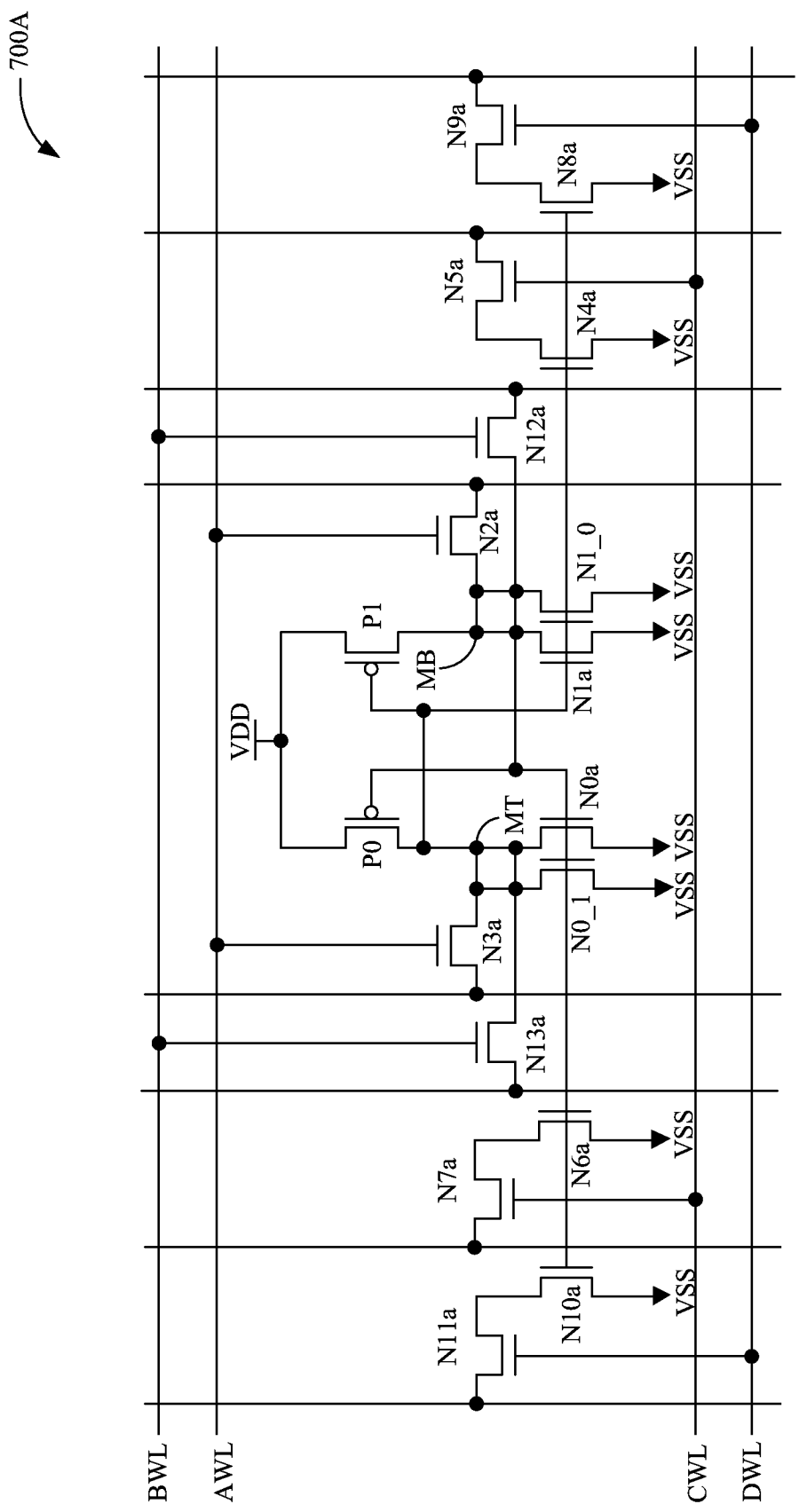
FIG. 7A is a schematic diagram of a portion of a memory cell in accordance with one or more embodiments.

FIG. 7A is a schematic diagram of a portion of a memory cell 700A in accordance with one or more embodiments. Memory cell 700A is an embodiment of the memory cell 100 (shown in FIG. 1) with similar elements. As shown in FIG. 7A, similar elements have a same reference number as shown in FIG. 1. In comparison with memory cell 100 (shown in FIG. 1), memory cell 700A also includes NMOS transistors N2, N3, N5, N7, N8, N9, N10, N11, N12, N13, N0_1 and N1_1. In some embodiments, memory cell 700A is a portion of one or more four port (4P) SRAM cells. In some embodiments, write ports or read ports are used. In some embodiments, additional write ports and/or read ports are used. In some embodiments, memory cell 700A employs a number of transistors other than eighteen. In some embodiments, memory cell 700A is usable in a memory cell array. In some embodiments, one or more of NMOS transistor N2, N3, N5, N7, N8, N9, N10, N11, N12, N13, N0_1 and N1_1 include three-dimensional gate structures, e.g., FinFETs. In comparison with memory cell 100 (shown in FIG. 1), the NMOS transistors N4 and N6 of memory cell 700A are arranged in a different configuration. In some embodiments, memory cell 700A includes three-dimensional gate structures, e.g., FinFET. In some embodiments, memory cell 700A is a portion of a 3-Dimensional (3D) structure enabling ultra-high density integration at the individual transistor-level. In a 3D IC, each of the device layers is fabricated sequentially and is stacked upon the preceding layer.

NMOS transistor N0_1 is arranged in a parallel configuration with NMOS transistor N0 to increase the driving capability of NMOS transistors N0_1 and N0.

NMOS transistor N1_1 is arranged in a parallel configuration with NMOS transistor N1 to increase the driving capability of NMOS transistors N0_1 and N1.

NMOS transistor N2 is configured to selectively connect cross-coupled inverters 102 and 104 to a first bit line bar ABLB. In some embodiments, NMOS transistor N2 is connected between first bit line bar ABLB and reference node MB. The gate of NMOS transistor N2 is connected to the first word line AWL. Both NMOS transistor N2 and NMOS transistor N3 are configured to be activated based on a signal supplied by a first word line AWL.

NMOS transistor N3 is configured to selectively connect cross-coupled inverters 102 and 104 to a first bit line ABL. In some embodiments, NMOS transistor N3 is connected between first bit line ABL and reference node MT. The gate of NMOS transistor N3 is connected to the first word line AWL.

The gate of NMOS transistor N4 is connected to the gate of NMOS transistor N1. The drain of NMOS transistor N4 is connected to NMOS transistor N5. The source of NMOS transistor N4 is connected to ground reference node VSS.

NMOS transistor N5 is coupled between third bit line CBL and the drain of NMOS transistor N4. Third word line CWL is coupled with a gate of NMOS transistor N5. NMOS transistor N5 functions as a pass gate controlled by third word line CWL. In some embodiments, third word line CWL is a read word line.

The gate of NMOS transistor N6 is connected to the gate of NMOS transistor N0. The drain of NMOS transistor N6 is connected to NMOS transistor N7. The source of NMOS transistor N6 is connected to ground reference node VSS.

NMOS transistor N7 is coupled between third bit line bar CBLB and the drain of NMOS transistor N6. Third word line CWL is coupled with a gate of NMOS transistor N7. NMOS transistor N7 functions as a pass gate controlled by third word line CWL. In some embodiments, third word line CWL is a read word line.

The gate of NMOS transistor N8 is connected to the gates of NMOS transistors N1 and N4. The drain of NMOS transistor N8 is connected to NMOS transistor N9. The source of NMOS transistor N8 is connected to ground reference node VSS.

NMOS transistor N9 is coupled between fourth bit line DBL and the drain of NMOS transistor N8. Fourth word line DWL is coupled with a gate of NMOS transistor N9. NMOS transistor N9 functions as a pass gate controlled by fourth word line DWL. In some embodiments, fourth word line DWL is a read word line.

The gate of NMOS transistor N10 is connected to the gates of NMOS transistors N0 and N6. The drain of NMOS transistor N10 is connected to NMOS transistor N11. The source of NMOS transistor N10 is connected to ground reference node VSS.

NMOS transistor N11 is coupled between fourth bit line bar DBLB and the drain of NMOS transistor N6. Fourth word line DWL is coupled with a gate of NMOS transistor N11. NMOS transistor N11 functions as a pass gate controlled by fourth word line DWL. In some embodiments, fourth word line DWL is a read word line.

NMOS transistor N12 is configured to selectively connect cross-coupled inverters 102 and 104 to a second bit line bar BBLB. In some embodiments, NMOS transistor N12 is connected between second bit line bar BBLB and reference node MB. The gate of NMOS transistor N12 is connected to the second word line BWL. Both NMOS transistor N12 and NMOS transistor N13 are configured to be activated based on a signal supplied by a second word line BWL.

NMOS transistor N13 is configured to selectively connect cross-coupled inverters 102 and 104 to a second bit line BBL. In some embodiments, NMOS transistor N13 is connected between second bit line BBL and reference node MT. The gate of NMOS transistor N13 is connected to the second word line BWL.

Figure 7B:
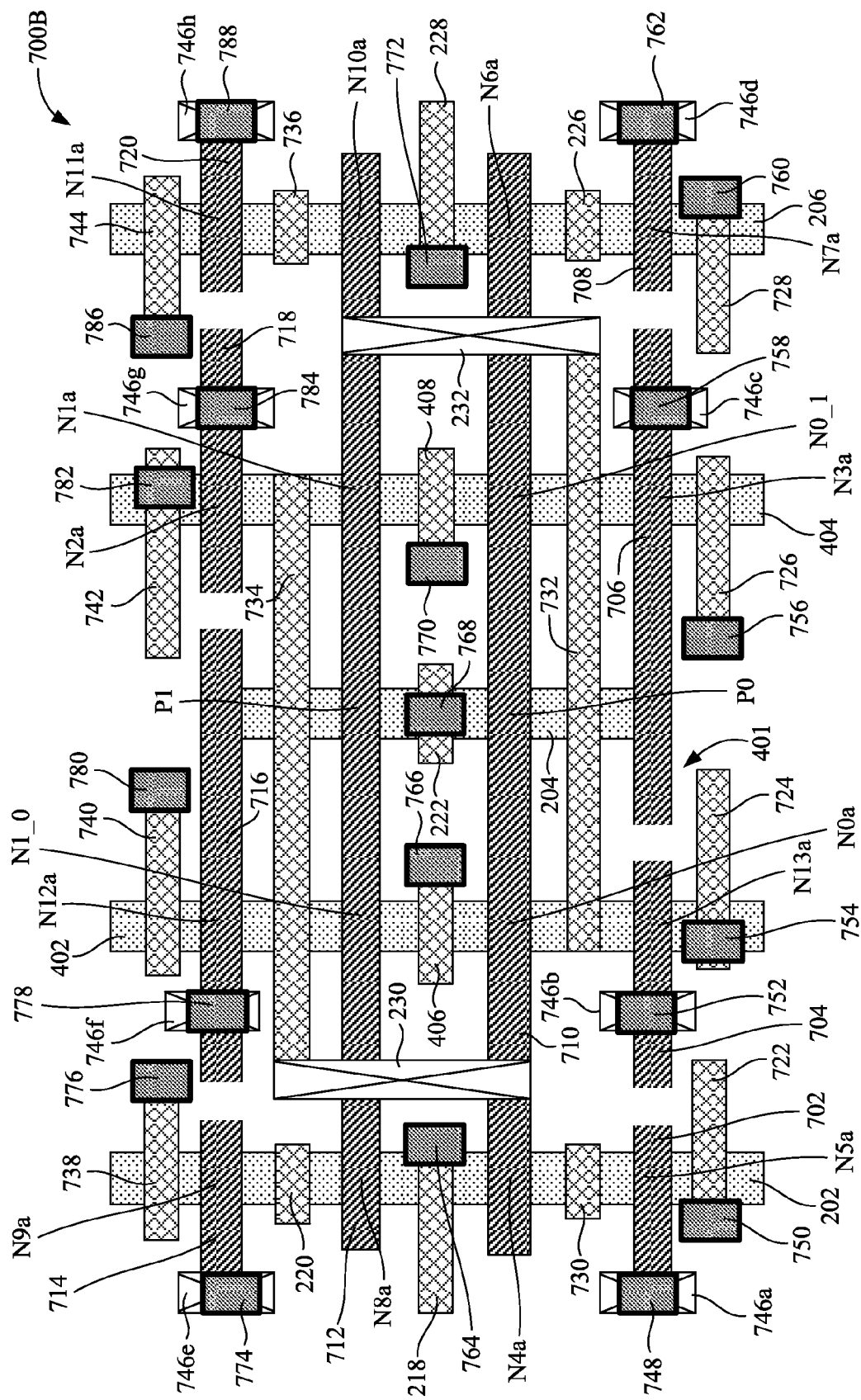
FIG. 7B is a portion of a layout diagram of the memory cell in FIG. 7A in accordance with one or more embodiments.

FIG. 7B is a portion of a layout diagram 700B of the memory cell in FIG. 7A in accordance with one or more embodiments. Layout diagram 700B is an embodiment of layout diagram 400 (shown in FIG. 4) with similar elements. As shown in FIG. 7B, similar elements have a same reference number as shown in FIG. 4. In comparison with layout diagram 400 (shown in FIG. 4), layout diagram 700B also includes polysilicon layer 702, 704, 706, 708, 710, 712, 714, 716, 718 and 720, first interconnection structures 722, 724, 726, 728, 730, 732, 734, 736, 738, 740, 742, and 744, second interconnection structures 746a, 746b, 746c, 746d, 746e, 746f, 746g and 746h, and first conductive lines 748, 750, 752, 754, 756, 758, 760, 762, 764, 766, 768, 770, 772, 774, 776, 778, 780, 782, 784, 786 and 788.

First interconnection structures 722, 724, 726, 728, 730, 732, 734, 736, 738, 740, 742, and 744 correspond to interconnection structures of a common layer.

Second interconnection structures 746a, 746b, 746c, 746d, 746e, 746f, 746g and 746h correspond to interconnection structures of another common layer.

First interconnection structure 406, polysilicon structure 710, OD region 402, and first interconnection structure 732 define NMOS transistor N0a (as shown in FIG. 7A). Polysilicon structure 710 corresponds to the gate of NMOS transistor N0a, first interconnection structure 406 corresponds to the source of NMOS transistor N0a, and first interconnection structure 732 corresponds to reference node MT.

First interconnection structure 408, polysilicon structure 710, OD region 404, and first interconnection structure 732 define NMOS transistor N0_1 (as shown in FIG. 7A). Polysilicon structure 710 corresponds to the gate of NMOS transistor N0_1, first interconnection structure 408 corresponds to the source of NMOS transistor N0_1, and first interconnection structure 732 corresponds to reference node MT.

First interconnection structure 408, polysilicon structure 712, OD region 404, and first interconnection structure 734 define NMOS transistor N1a (as shown in FIG. 7A). Polysilicon structure 712 corresponds to the gate of NMOS transistor N1a, first interconnection structure 408 corresponds to the source of NMOS transistor N1a, and first interconnection structure 734 corresponds to reference node MB.

First interconnection structure 406, polysilicon structure 712, OD region 402, and first interconnection structure 734 define NMOS transistor N1_0 (as shown in FIG. 7A). Polysilicon structure 712 corresponds to the gate of NMOS transistor N1_0, first interconnection structure 406 corresponds to the source of NMOS transistor N1_0, and first interconnection structure 734 corresponds to reference node MB.

First interconnection structure 742, polysilicon structure 718, OD region 404, and first interconnection structure 734 define NMOS transistor N2a (as shown in FIG. 7A). Polysilicon structure 718 corresponds to the gate of NMOS transistor N2a, first interconnection structure 742 corresponds to the source of NMOS transistor N2a, and first interconnection structure 734 corresponds to reference node MB.

First interconnection structure 726, polysilicon structure 706, OD region 404, and first interconnection structure 732 define NMOS transistor N3a (as shown in FIG. 7A). Polysilicon structure 706 corresponds to the gate of NMOS transistor N3a, first interconnection structure 726 corresponds to the source of NMOS transistor N3a, and first interconnection structure 732 corresponds to reference node MT.

First interconnection structure 218, polysilicon structure 710, OD region 202, and first interconnection structure 730 define NMOS transistor N4a (as shown in FIG. 7A). Polysilicon structure 710 corresponds to the gate of NMOS transistor N4a, first interconnection structure 218 corresponds to the source of NMOS transistor N4a, and first interconnection structure 730 corresponds to the drain of NMOS transistor N4a.

First interconnection structure 722, polysilicon structure 702, OD region 202, and first interconnection structure 730 define NMOS transistor N5a (as shown in FIG. 7A). Polysilicon structure 702 corresponds to the gate of NMOS transistor N5a, first interconnection structure 722 corresponds to the source of NMOS transistor N5a, and first interconnection structure 730 corresponds to the drain of NMOS transistor N5a.

First interconnection structure 228, polysilicon structure 710, OD region 206, and first interconnection structure 226 define NMOS transistor N6a (as shown in FIG. 7A). Polysilicon structure 710 corresponds to the gate of NMOS transistor N6a, first interconnection structure 228 corresponds to the source of NMOS transistor N6a, and first interconnection structure 226 corresponds to the drain of NMOS transistor N6a.

First interconnection structure 728, polysilicon structure 708, OD region 206, and first interconnection structure 226 define NMOS transistor N7a (as shown in FIG. 7A). Polysilicon structure 708 corresponds to the gate of NMOS transistor N7a, first interconnection structure 728 corresponds to the source of NMOS transistor N7a, and first interconnection structure 226 corresponds to the drain of NMOS transistor N7a.

First interconnection structure 218, polysilicon structure 712, OD region 202, and first interconnection structure 220 define NMOS transistor N8a (as shown in FIG. 7A). Polysilicon structure 712 corresponds to the gate of NMOS transistor N8a, first interconnection structure 218 corresponds to the source of NMOS transistor N8a, and first interconnection structure 220 corresponds to the drain of NMOS transistor N8a.

First interconnection structure 738, polysilicon structure 714, OD region 202, and first interconnection structure 220 define NMOS transistor N9a (as shown in FIG. 7A). Polysilicon structure 714 corresponds to the gate of NMOS transistor N9a, first interconnection structure 738 corresponds to the source of NMOS transistor N9a, and first interconnection structure 220 corresponds to the drain of NMOS transistor N9a.

First interconnection structure 228, polysilicon structure 712, OD region 206, and first interconnection structure 736 define NMOS transistor N10a (as shown in FIG. 7A). Polysilicon structure 712 corresponds to the gate of NMOS transistor N10a, first interconnection structure 228 corresponds to the source of NMOS transistor N10a, and first interconnection structure 736 corresponds to the drain of NMOS transistor N10a.

First interconnection structure 744, polysilicon structure 720, OD region 206, and first interconnection structure 736 define NMOS transistor N11a (as shown in FIG. 7A). Polysilicon structure 720 corresponds to the gate of NMOS transistor N11a, first interconnection structure 744 corresponds to the source of NMOS transistor N11a, and first interconnection structure 736 corresponds to the drain of NMOS transistor N11a.

First interconnection structure 740, polysilicon structure 716, OD region 402, and first interconnection structure 734 define NMOS transistor N12a (as shown in FIG. 7A). Polysilicon structure 716 corresponds to the gate of NMOS transistor N12a, first interconnection structure 740 corresponds to the source of NMOS transistor N12a, and first interconnection structure 734 corresponds to reference node MB.

First interconnection structure 724, polysilicon structure 704, OD region 402, and first interconnection structure 732 define NMOS transistor N13a (as shown in FIG. 7A). Polysilicon structure 704 corresponds to the gate of NMOS transistor N13a, first interconnection structure 724 corresponds to the source of NMOS transistor N13a, and first interconnection structure 732 corresponds to reference node MT.

The gates of NMOS transistors NW and N0_1, and PMOS transistor P0 are directly connected by polysilicon structure 710. The gates of NMOS transistors N1a and N1_0, and PMOS transistor P1 are directly connected by polysilicon structure 712.

Second interconnection structure 230 connects the drain of PMOS transistor P1, the drains of NMOS transistors N1a and N1_0, the gates of NMOS transistors N0a, N0_1, N4a and N6a, and the gate of PMOS transistor P0.

Second interconnection structure 232 connects the drain of PMOS transistor P0, the drains of NMOS transistors N0 and N0_1, the gates of NMOS transistors N1a, N1_0, N8a and N10a, and the gate of PMOS transistor P1.

Second interconnection structure 746a is electrically connected to at least the gate of NMOS transistor N5a and first conductive line 748.

Second interconnection structure 746b is electrically connected to at least the gate of NMOS transistor N0a and first conductive line 752.

Second interconnection structure 746c is electrically connected to at least the gate of NMOS transistor N3a and first conductive line 758.

Second interconnection structure 746d is electrically connected to at least the gate of NMOS transistor N7a and first conductive line 762.

Second interconnection structure 746e is electrically connected to at least the gate of NMOS transistor N9a and first conductive line 774.

Second interconnection structure 746f is electrically connected to at least the gate of NMOS transistor N12a and first conductive line 778.

Second interconnection structure 746g is electrically connected to at least the gate of NMOS transistor N2a and first conductive line 784.

Second interconnection structure 746h is electrically connected to at least the gate of NMOS transistor N11a and first conductive line 788.

First conductive line 748 is configured to provide an electrical connection between second interconnection structure 746a and first metal structure 802 (shown in FIG. 7C). In some embodiments, second interconnection structure 746a and first metal structure 802 are on different layers of memory cell 700A.

First conductive line 750 is configured to provide an electrical connection between first interconnection structure 722 and first metal structure 806 (shown in FIG. 6C). In some embodiments, first interconnection structure 722 and first metal structure 806 are on different layers of memory cell 700A.

First conductive line 752 is configured to provide an electrical connection between second interconnection structure 746b and first metal structure 812 (shown in FIG. 7C). In some embodiments, second interconnection structure 746b and first metal structure 812 are on different layers of memory cell 700A.

First conductive line 754 is configured to provide an electrical connection between first interconnection structure 724 and first metal structure 814 (shown in FIG. 6C). In some embodiments, first interconnection structure 724 and first metal structure 814 are on different layers of memory cell 700A.

First conductive line 756 is configured to provide an electrical connection between first interconnection structure 726 and first metal structure 822 (shown in FIG. 6C). In some embodiments, first interconnection structure 726 and first metal structure 822 are on different layers of memory cell 700A.

First conductive line 758 is configured to provide an electrical connection between second interconnection structure 746c and first metal structure 828 (shown in FIG. 7C). In some embodiments, second interconnection structure 746c and first metal structure 828 are on different layers of memory cell 700A.

First conductive line 760 is configured to provide an electrical connection between first interconnection structure 728 and first metal structure 834 (shown in FIG. 7C). In some embodiments, first interconnection structure 728 and first metal structure 834 are on different layers of memory cell 700A.

First conductive line 762 is configured to provide an electrical connection between first interconnection structure 708 and first metal structure 836 (shown in FIG. 7C). In some embodiments, first interconnection structure 708 and first metal structure 836 are on different layers of memory cell 700A.

First conductive line 764 is configured to provide an electrical connection between first interconnection structure 218 and first metal structure 808 (shown in FIG. 7C). In some embodiments, first interconnection structure 218 and first metal structure 808 are on different layers of memory cell 700A.

First conductive line 766 is configured to provide an electrical connection between first interconnection structure 406 and first metal structure 816 (shown in FIG. 7C). In some embodiments, first interconnection structure 406 and first metal structure 816 are on different layers of memory cell 700A.

First conductive line 768 is configured to provide an electrical connection between first interconnection structure 222 and first metal structure 820 (shown in FIG. 7C). In some embodiments, first interconnection structure 222 and first metal structure 820 are on different layers of memory cell 700A.

First conductive line 770 is configured to provide an electrical connection between first interconnection structure 408 and first metal structure 824 (shown in FIG. 7C). In some embodiments, first interconnection structure 408 and first metal structure 824 are on different layers of memory cell 700A.

First conductive line 772 is configured to provide an electrical connection between first interconnection structure 228 and first metal structure 832 (shown in FIG. 7C). In some embodiments, first interconnection structure 228 and first metal structure 832 are on different layers of memory cell 700A.

First conductive line 774 is configured to provide an electrical connection between second interconnection structure 746e and first metal structure 804 (shown in FIG. 7C). In some embodiments, second interconnection structure 746e and first metal structure 804 are on different layers of memory cell 700A.

First conductive line 776 is configured to provide an electrical connection between first interconnection structure 738 and first metal structure 810 (shown in FIG. 7C). In some embodiments, first interconnection structure 738 and first metal structure 810 are on different layers of memory cell 700A.

First conductive line 778 is configured to provide an electrical connection between second interconnection structure 746f and first metal structure 812 (shown in FIG. 7C). In some embodiments, second interconnection structure 746f and first metal structure 812 are on different layers of memory cell 700A.

First conductive line 780 is configured to provide an electrical connection between first interconnection structure 740 and first metal structure 818 (shown in FIG. 7C). In some embodiments, first interconnection structure 740 and first metal structure 818 are on different layers of memory cell 700A.

First conductive line 782 is configured to provide an electrical connection between first interconnection structure 742 and first metal structure 826 (shown in FIG. 7C). In some embodiments, first interconnection structure 742 and first metal structure 826 are on different layers of memory cell 700A.

First conductive line 784 is configured to provide an electrical connection between second interconnection structure 746g and first metal structure 828 (shown in FIG. 7C). In some embodiments, second interconnection structure 746g and first metal structure 828 are on different layers of memory cell 700A.

First conductive line 786 is configured to provide an electrical connection between first interconnection structure 744 and first metal structure 830 (shown in FIG. 7C). In some embodiments, first interconnection structure 744 and first metal structure 830 are on different layers of memory cell 700A.

First conductive line 788 is configured to provide an electrical connection between second interconnection structure 746h and first metal structure 838 (shown in FIG. 7C). In some embodiments, second interconnection structure 746h and first metal structure 838 are on different layers of memory cell 700A.

In some embodiments, each of the first conductive lines 748, 750, 752, 754, 756, 758, 760, 762, 764, 766, 768, 770, 772, 774, 776, 778, 780, 782, 784, 786 and 788 independently is a metal line, a via, a TSV, an ILV, or another suitable conductive line. In some embodiments, each of the first conductive lines 748, 750, 752, 754, 756, 758, 760, 762, 764, 766, 768, 770, 772, 774, 776, 778, 780, 782, 784, 786 and 788 independently includes copper, aluminum, nickel, titanium, tungsten or another suitable conductive material. In some embodiments, each of the first conductive lines 748, 750, 752, 754, 756, 758, 760, 762, 764, 766, 768, 770, 772, 774, 776, 778, 780, 782, 784, 786 and 788 independently includes one or more conductive line portions.

Figure 8:
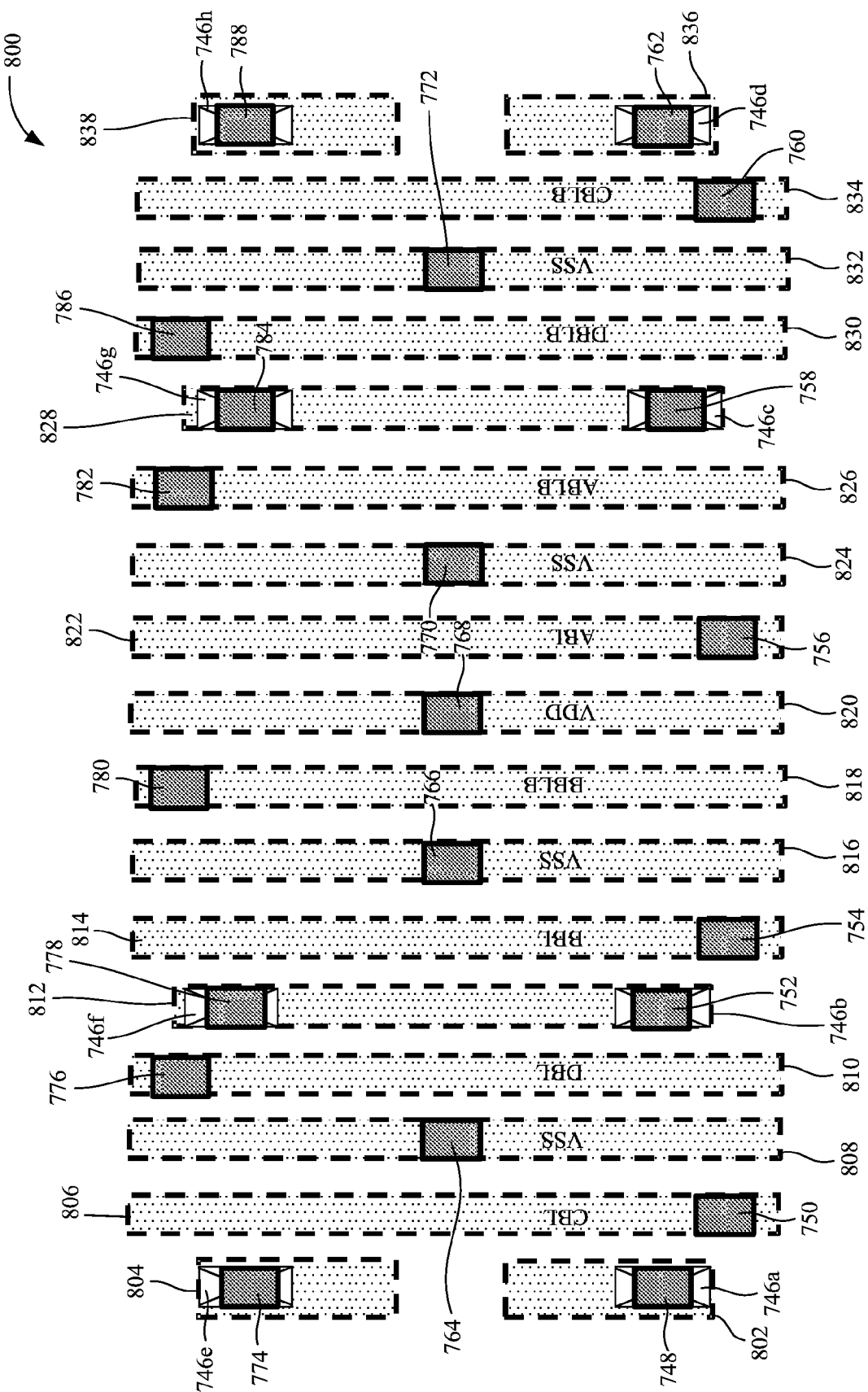
FIG. 8 is a portion of a layout diagram of the memory cell in FIG. 7A in accordance with one or more embodiments.

FIG. 8 is a portion of a layout diagram 800 of the memory cell in FIG. 7A in accordance with one or more embodiments. Layout diagram 800 is an embodiment of layout diagram 700B (shown in FIG. 7B) with similar elements. As shown in FIG. 8, similar elements have a same reference number as shown in FIG. 7B. In comparison with layout diagram 700B (shown in FIG. 7B), layout diagram 800 also includes first metal structures 802, 804, 806, 808, 810, 812, 814, 816, 818, 820, 822, 824, 826, 828, 830, 832, 834 836 and 838. In comparison with layout diagram 700B (shown in FIG. 7B), layout diagram 800 does not include polysilicon layer 702, 704, 706, 708, 710, 712, 714, 716, 718 and 720, and first interconnection structures 722, 724, 726, 728, 730, 732, 734, 736, 738, 740, 742, and 744 (for illustrative purposes).

Figure 9:
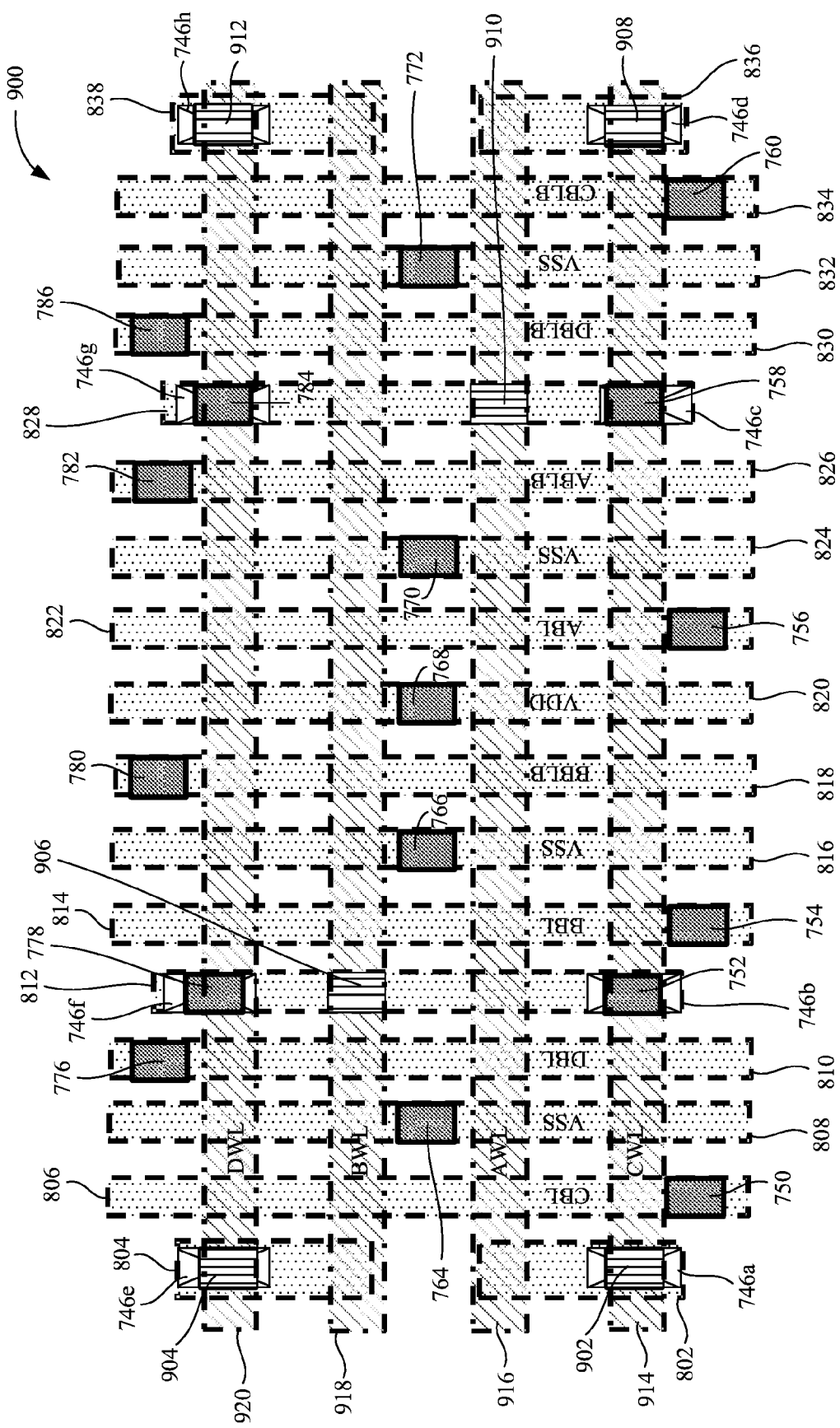
FIG. 9 is a portion of a layout diagram of the memory cell in FIG. 7A in accordance with one or more embodiments.

First metal structure 802 is configured to electrically connect the gate of NMOS transistor N5a to the second metal structure 914 (shown in FIG. 9). In some embodiments, first metal structure 802 and second metal structure 914 are on different layers of memory cell 700A. In some embodiments, second metal structure 914 or 916 vertically overlaps first metal structure 802.

First metal structure 804 is configured to electrically connect the gate of NMOS transistor N9a to the second metal structure 920 (shown in FIG. 9). In some embodiments, first metal structure 804 and second metal structure 920 are on different layers of memory cell 700A. In some embodiments, second metal structure 918 or 920 vertically overlaps first metal structure 804.

First metal structure 806 is configured to electrically connect the source of NMOS transistor N5a to the third bit line CBL. In some embodiments, second metal structure 914, 916, 918 or 920 vertically overlaps first metal structure 806.

First metal structure 808 is configured to electrically connect the source of NMOS transistors N8a and N4a to the ground reference node VSS. In some embodiments, second metal structure 914, 916, 918 or 920 vertically overlaps first metal structure 808.

First metal structure 810 is configured to electrically connect the source of NMOS transistor N9a to the fourth bit line DBL. In some embodiments, second metal structure 914, 916, 918 or 920 vertically overlaps first metal structure 810.

First metal structure 812 is configured to electrically connect the gates of NMOS transistors N12a and N13a to each other (by second interconnecting regions 746b and 746f, and first conductive lines 752 and 778). In some embodiments, second metal structure 914, 916, 918 or 920 vertically overlaps first metal structure 812.

First metal structure 814 is configured to electrically connect the source of NMOS transistor N13a to the second bit line BBL. In some embodiments, second metal structure 914, 916, 918 or 920 vertically overlaps first metal structure 814.

First metal structure 816 is configured to electrically connect the source of NMOS transistors NW and N1_0 to the ground reference node VSS. In some embodiments, second metal structure 914, 916, 918 or 920 vertically overlaps first metal structure 816.

First metal structure 818 is configured to electrically connect the source of NMOS transistor N12a to the second bit line bar BBLB. In some embodiments, second metal structure 914, 916, 918 or 920 vertically overlaps first metal structure 818.

First metal structure 820 is configured to electrically connect the drain of PMOS transistors P0 and P1 to the power supply voltage VDD terminal. In some embodiments, second metal structure 914, 916, 918 or 920 vertically overlaps first metal structure 820.

First metal structure 822 is configured to electrically connect the source of NMOS transistor N3a to the first bit line ABL. In some embodiments, second metal structure 914, 916, 918 or 920 vertically overlaps first metal structure 822.

First metal structure 824 is configured to electrically connect the source of NMOS transistors N1a and N0_1 to the ground reference node VSS. In some embodiments, second metal structure 914, 916, 918 or 920 vertically overlaps first metal structure 824.

First metal structure 826 is configured to electrically connect the source of NMOS transistor N2a to the first bit line bar ABLB. In some embodiments, second metal structure 914, 916, 918 or 920 vertically overlaps first metal structure 826.

First metal structure 828 is configured to electrically connect the gates of NMOS transistors N2a and N3a to each other (by second interconnecting regions 746c and 746g, and first conductive lines 758 and 784). In some embodiments, second metal structure 914, 916, 918 or 920 vertically overlaps first metal structure 828.

First metal structure 830 is configured to electrically connect the source of NMOS transistor N11a to the fourth bit line bar DBLB. In some embodiments, second metal structure 914, 916, 918 or 920 vertically overlaps first metal structure 830.

First metal structure 832 is configured to electrically connect the source of NMOS transistors N6a and N10a to the ground reference node VSS. In some embodiments, second metal structure 914, 916, 918 or 920 vertically overlaps first metal structure 832.

First metal structure 834 is configured to electrically connect the source of NMOS transistor N7a to the third bit line bar CBLB. In some embodiments, second metal structure 914, 916, 918 or 920 vertically overlaps first metal structure 834.

First metal structure 836 is configured to electrically connect the gate of NMOS transistor N7a to the second metal structure 914 (shown in FIG. 9). In some embodiments, first metal structure 836 and second metal structure 914 are on different layers of memory cell 700A. In some embodiments, second metal structure 914 or 916 vertically overlaps first metal structure 836.

First metal structure 838 is configured to electrically connect the gate of NMOS transistor N11a to the second metal structure 920 (shown in FIG. 9). In some embodiments, first metal structure 838 and second metal structure 920 are on different layers of memory cell 700A. In some embodiments, second metal structure 918 or 920 vertically overlaps first metal structure 838.

In some embodiments, each of first metal structures 802, 804, 806, 808, 810, 812, 814, 816, 818, 820, 822, 824, 826, 828, 830, 832, 834 836 and 838 is a conductive material independently including copper, aluminum, alloys thereof or other suitable conductive materials. In some embodiments, each of first metal structures 802, 804, 806, 808, 810, 812, 814, 816, 818, 820, 822, 824, 826, 828, 830, 832, 834 836 and 838 is on a different layer from the other components in memory cell 500A.

FIG. 9 is a portion of a layout diagram 900 of the memory cell in FIG. 7A in accordance with one or more embodiments. Layout diagram 900 is an embodiment of layout diagram 800 (shown in FIG. 8) with similar elements. As shown in FIG. 9, similar elements have a same reference number as shown in FIG. 8. In comparison with layout diagram 800 (shown in FIG. 8), layout diagram 900 also includes second conductive lines 902, 904, 906, 908, 910 and 912, and second metal structures 914, 916, 918 and 920.

Second conductive line 902 is configured to provide an electrical connection between second metal structure 914 and first metal structure 802.

Second conductive line 904 is configured to provide an electrical connection between second metal structure 920 and first metal structure 804.

Second conductive line 906 is configured to provide an electrical connection between second metal structure 918 and first metal structure 812.

Second conductive line 908 is configured to provide an electrical connection between second metal structure 914 and first metal structure 836.

Second conductive line 910 is configured to provide an electrical connection between second metal structure 916 and first metal structure 828.

Second conductive line 912 is configured to provide an electrical connection between second metal structure 920 and first metal structure 838.

In some embodiments, each of the second conductive lines 902, 904, 906, 908, 910 and 912 independently is a metal line, a via, a TSV, an ILV, or another suitable conductive line. In some embodiments, each of the second conductive lines 902, 904, 906, 908, 910 and 912 independently includes copper, aluminum, nickel, titanium, tungsten or another suitable conductive material. In some embodiments, each of the second conductive lines 902, 904, 906, 908, 910 and 912 independently includes one or more conductive line portions.

Second metal structure 914 is configured to electrically connect the gates of NMOS transistors N5a and N7a to the third word line CWL by second interconnecting regions 746a and 746d, first conductive lines 748 and 762, first metal structures 802 and 836 and second conductive lines 902 and 908.

Second metal structure 916 is configured to electrically connect the gates of NMOS transistors N2a and N3a to the first word line AWL by second interconnecting regions 746c and 746g, first conductive lines 758 and 784, first metal structure 828 and second conductive line 910.

Second metal structure 918 is configured to electrically connect the gates of NMOS transistors N12a and N13a to the second word line BWL by second interconnecting regions 746b and 746f, first conductive lines 752 and 778, first metal structure 812 and second conductive line 906.

Second metal structure 920 is configured to electrically connect the gates of NMOS transistors N9a and N11a to the fourth word line DWL by second interconnecting regions 746e and 746h, first conductive lines 774 and 788, first metal structures 804 and 838 and second conductive lines 904 and 912.

In some embodiments, each of second metal structures 914, 916, 918 and 920 independently is a conductive material including copper, aluminum, alloys thereof or other suitable conductive materials. In some embodiments, each of second metal structures 914, 916, 918 and 920 independently is on a different layer from the other components in memory cell 700A.

In some embodiments, as shown in FIGS. 7A-7B, 8 and 9, the cell width and the area occupied by layout 700B, 800 and 900 of memory cell 700A are reduced since the number of metal lines (e.g., first metal structures 802, 804, 806, 808, 810, 812, 814, 816, 818, 820, 822, 824, 826, 828, 830, 832, 834 836 and 838) is reduced when compared with other four-port memory cell layouts.

Figure 10:
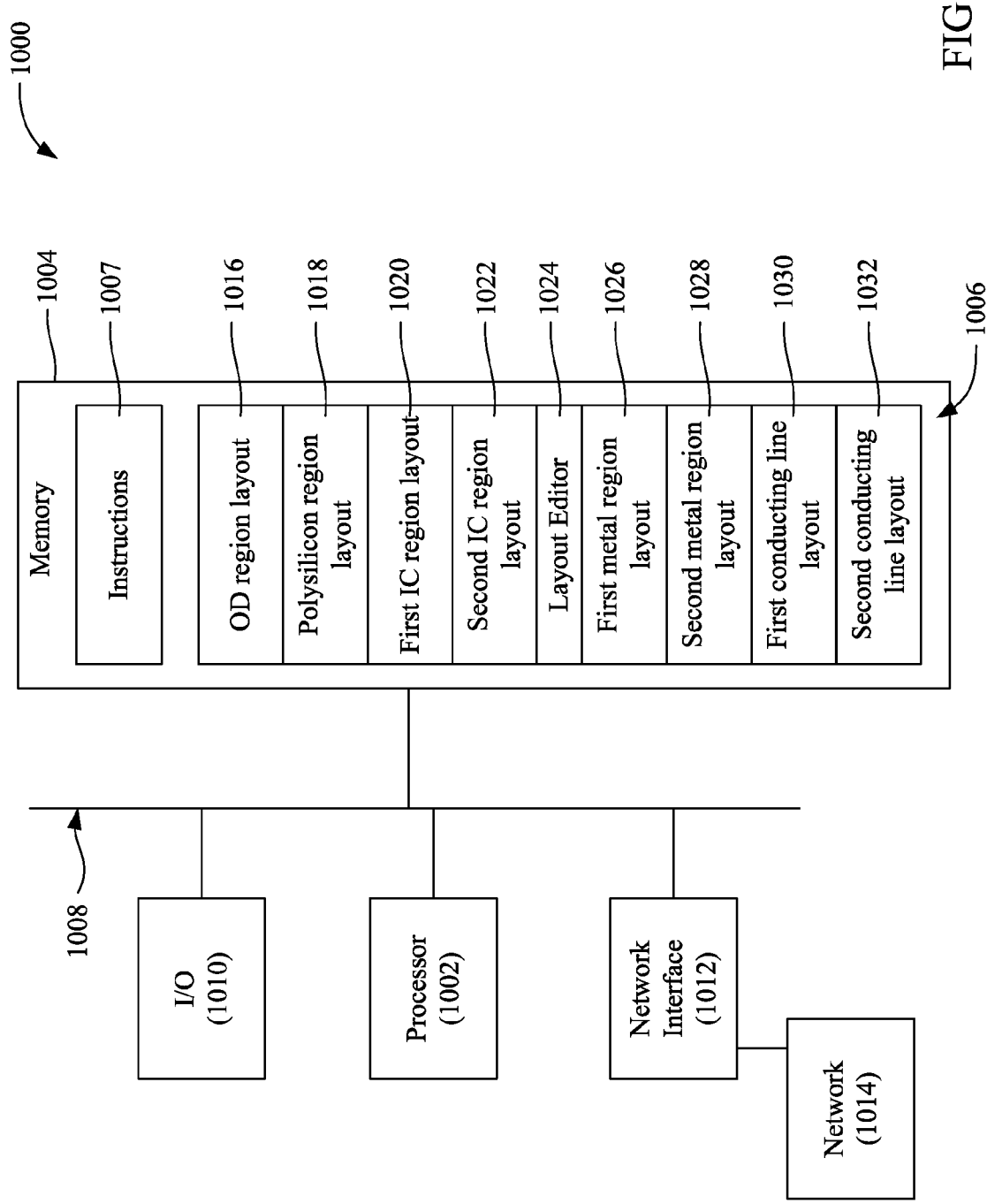
FIG. 10 is a block diagram of a control system in accordance with one or more embodiments.

FIG. 10 is a block diagram of an integrated circuit designing system 1000 for designing a semiconductor device in accordance with one or more embodiments. In some embodiments, the system 1000 is a general purpose computing device which implements method 1100 of FIG. 11 in accordance with one or more embodiments. Control system 1000 includes a hardware processor 1002 and a non-transitory, computer readable storage medium 1004 encoded with, i.e., storing, the computer program code 1006, i.e., a set of executable instructions. Computer readable storage medium 1004 is also encoded with instructions 1007 for interfacing with manufacturing machines for producing the semiconductor device. The processor 1002 is electrically coupled to the computer readable storage medium 1004 via a bus 1008. The processor 1002 is also electrically coupled to an I/O interface 1010 by bus 1008. A network interface 1012 is also electrically connected to the processor 1002 via bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described e.g., in method 1100.

In one or more embodiments, the processor 1002 is a central processing unit (CPU), a multi-processor, a distributed processing system, an application specific integrated circuit (ASIC), and/or a suitable processing unit.

In one or more embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 1004 includes a compact disk-read only memory (CD-ROM), a compact disk-read/write (CD-R/W), and/or a digital video disc (DVD).

In one or more embodiments, the storage medium 1004 stores the computer program code 1006 configured to cause system 1000 to perform method 1100. In one or more embodiments, the storage medium 1004 also stores information needed for performing method 1100 as well as information generated during performing method 1100, such as OD region layout 1016, polysilicon structure layout 1018, first interconnecting (IC) region layout 1020, second IC region layout 1022, layout editor 1024, first metal structure layout 1026, second metal structure layout 1028, first conducting line layout 1030, second conducting line layout 1032, and/or a set of executable instructions to perform the operation of method 1100.

In one or more embodiments, the storage medium 1004 stores instructions 1007 for interfacing with external machines. The instructions 1007 enable processor 1002 to generate instructions readable by the external machines to effectively implement method 1100 during a design process. In some embodiments, the design process is of a semiconductor device including one or more circuit elements.

Control system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

Control system 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1394. In one or more embodiments, method 1100 are implemented in two or more systems 1000, and information such as OD region layout 1016, polysilicon structure layout 1018, first interconnecting (IC) region layout 1020, second IC region layout 1022, layout editor 1024, first metal structure layout 1026, second metal structure layout 1028, first conducting line layout 1030, second conducting line layout 1032 are exchanged between different systems 1000 via network 1014.

Control system 1000 is configured to receive information related to a UI through I/O interface 1010. The information is transferred to processor 1002 via bus 1008 to generate OD region layout. The UI is then stored in computer readable medium 1004 as OD region layout 1016 1016. Control system 1000 is configured to receive information related to a polysilicon structure layout through I/O interface 1010. The information is stored in computer readable medium 1004 as polysilicon structure layout 1018. Control system 1000 is configured to receive information related to a first IC region layout through I/O interface 1010. The information is stored in computer readable medium 1004 as first IC region layout 1020. Control system 1000 is configured to receive information related to a second IC region layout through I/O interface 1010. The information is stored in computer readable medium 1004 as second IC region layout 1022. Control system 1000 is configured to receive information related to a layout editor through I/O interface 1010. The information is stored in computer readable medium 1004 as layout editor 1024. Control system 1000 is configured to receive information related to a first metal structure layout through I/O interface 1010. The information is stored in computer readable medium 1004 as first metal structure layout 1026. Control system 1000 is configured to receive information related to a second metal structure layout through I/O interface 1010. The information is stored in computer readable medium 1004 as second metal structure layout 1028. Control system 1000 is configured to receive information related to a first conducting line layout through I/O interface 1010. The information is stored in computer readable medium 1004 as first conducting line layout 1030. Control system 1000 is configured to receive information related to a second conducting line layout through I/O interface 1010. The information is stored in computer readable medium 1004 as second conducting line layout 1032.

Figure 11:
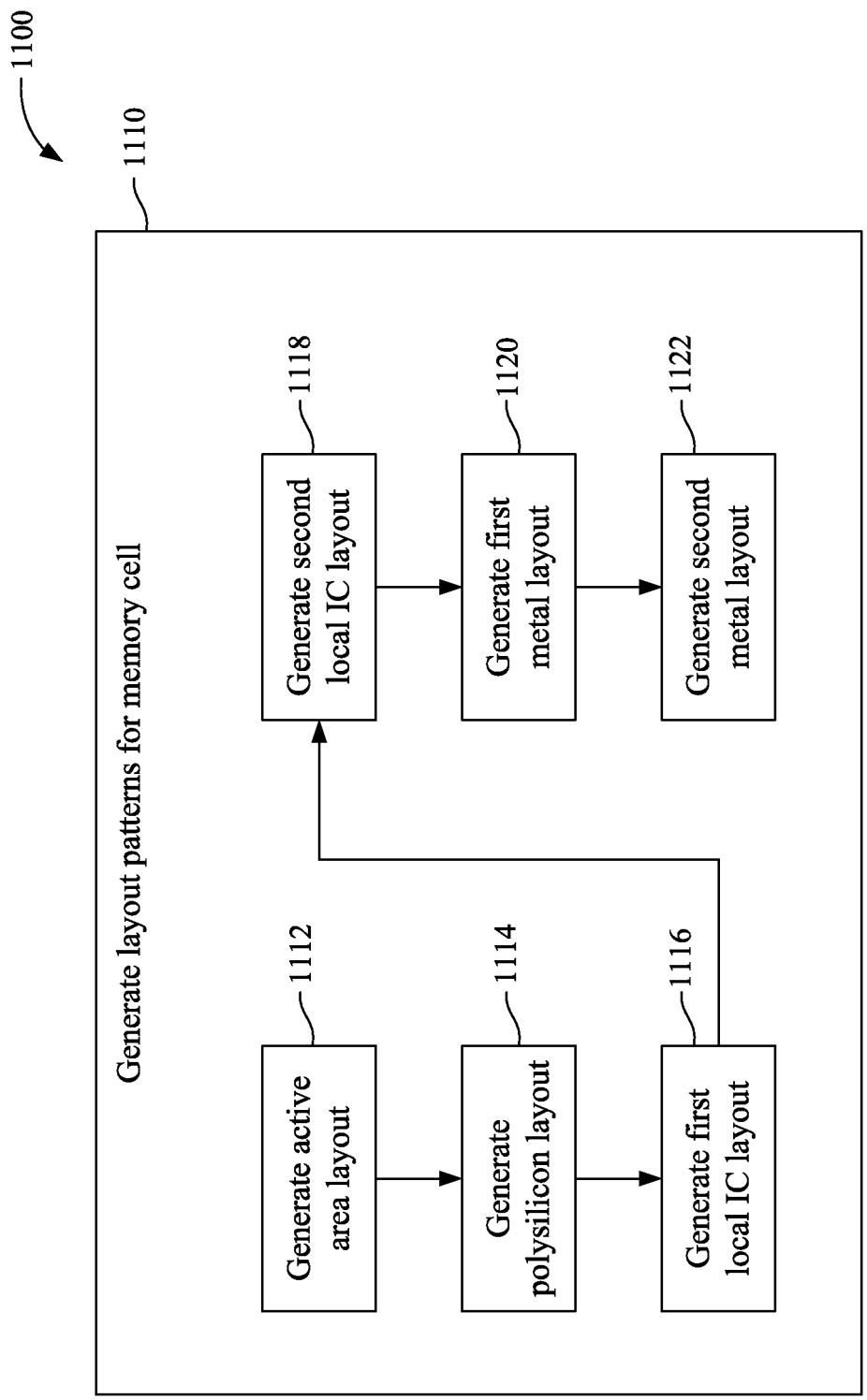
FIG. 11 is flowchart of a method of generating a layout design in accordance with one or more embodiments.

FIG. 11 is a flowchart of a method 1100 of generating a layout design in accordance with one or more embodiments. It is understood that additional operations may be performed before, during, and/or after the method 1100 depicted in FIG. 11, and that some other processes may only be briefly described herein. In some embodiments, the method 1100 is performed by operating a hardware computer (such as computer system 1000 in FIG. 10).

In operation 1110, layout patterns of a memory cell, such as layout patterns depicted in FIGS. 3, 4, 5B-5D, 6B-6D, 7B, 8 and 9, are generated. The generated layout patterns include one or more layout patterns for forming SRAM memory cell structures. In some embodiments, the one or more layout patterns for forming SRAM memory cell structures overlap at least one, and not necessarily both, of corresponding active layout pattern and the corresponding isolation region of the memory cell.

For example, operation 1110 includes generating an active area layout pattern associated with forming an active area (e.g., OD regions 202, 204, 206, 402 and 404) of the memory cell, and an isolation region that is located outside of at least the active area layout pattern (operation 1112).

Operation 1110 further includes generating a polysilicon layout pattern associated with forming a polysilicon structure of the memory cell, and the polysilicon layout pattern is configured to overlap the active area layout pattern (operation 1114).

Operation 1110 further includes generating a first interconnection layout pattern associated with forming a first interconnection structure of the memory cell (operation 1116). In some embodiments, the first interconnection layout pattern being configured to overlap the first active area layout pattern.

Operation 1110 further includes generating a second interconnection layout pattern associated with forming a second interconnection structure of the memory cell (operation 1118). The second interconnection layout pattern is configured to overlap the isolation region.

Operation 1110 further includes generating a first metal layout pattern associated with forming a first metal structure of the memory cell (operation 1120). The first metal layout pattern being configured to overlap at least the first polysilicon structure and the first interconnection structure.

Operation 1110 further includes generating a second metal layout pattern associated with forming a second metal structure of the memory cell (operation 1122). The second metal layout pattern being configured to overlap at least the first metal.

One aspect of this description relates to a layout design usable for manufacturing a memory cell includes a first active area layout pattern associated with forming a first active area of the memory cell, a second active area layout pattern associated with forming a second active area of the memory cell, wherein the first active area does not overlap the second active area, an isolation region located outside at least the first active area layout pattern and the second active area layout pattern, a first polysilicon layout pattern associated with forming a first polysilicon structure of the memory cell, wherein the first polysilicon layout pattern is configured to overlap the first active area layout pattern, a second polysilicon layout pattern associated with forming a second polysilicon structure of the memory cell, wherein the second polysilicon layout pattern is configured to overlap the first active area layout pattern and the second active area layout pattern, a first interconnection layout pattern associated with forming a first interconnection structure of the memory cell, wherein the first interconnection layout pattern is configured to overlap the second active area layout pattern, and a second interconnection layout pattern associated with forming a second interconnection structure of the memory cell, wherein the second interconnection layout pattern is configured to overlap the isolation region.

Still another aspect of this description relates to a semiconductor structure comprising a first active area structure, a second active area structure, wherein the first active area structure does not overlap the second active area structure, an isolation structure surrounding the first active area structure and the second active area structure, a first polysilicon structure over the first active area structure, a second polysilicon structure over the first active area structure and the second active area structure, a first interconnection structure over the second active area structure and a second interconnection structure over at least the isolation region.

Yet another aspect of this description relates to an integrated circuit designing system, comprising a non-transitory storage medium, the non-transitory storage medium being encoded with a layout design of a memory cell and a hardware processor communicatively coupled with the non-transitory storage medium and configured to execute a set of instructions for generating an integrated circuit layout based on an original circuit design and the layout design of the memory cell. The layout design comprising a first active area layout pattern associated with forming a first active area of the memory cell, a second active area layout pattern associated with forming a second active area of the memory cell, wherein the first active area does not overlap the second active area, an isolation region located outside at least the first active area layout pattern and the second active area layout pattern, a first polysilicon layout pattern associated with forming a first polysilicon structure of the memory cell, wherein the first polysilicon layout pattern overlapping the first active area layout pattern, a second polysilicon layout pattern associated with forming a second polysilicon structure of the memory cell, wherein the second polysilicon layout pattern overlapping the first active area layout pattern and the second active area layout pattern, a first interconnection layout pattern associated with forming a first interconnection structure of the memory cell, wherein the first interconnection layout pattern overlapping the second active area layout pattern, and a second interconnection layout pattern associated with forming a second interconnection structure of the memory cell, wherein the second interconnection layout pattern overlapping at least the isolation region.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first active area structure;
   a second active area structure, wherein the first active area structure does not overlap the second active area structure;
   an isolation structure surrounding the first active area structure and the second active area structure;
   a first polysilicon structure over the first active area structure;
   a second polysilicon structure over the first active area structure and the second active area structure;
   a first interconnection structure over the second active area structure;
   a second interconnection structure over at least the isolation region, wherein the second interconnection structure comprises:
      a third interconnection structure over at least the first polysilicon structure,
      a fourth interconnection structure over at least the second polysilicon structure,
      a first conductive line,
      a second conductive line, and
      a metal structure over and electrically coupled to the first conductive line and to the second conductive line, wherein the first conductive line is over the third interconnection structure and the second conductive line is over the fourth interconnection structure; and
   a fifth interconnection structure electrically coupled to the second active area structure between the first interconnection structure and the second polysilicon structure.

2. The semiconductor structure of claim 1, wherein the first polysilicon structure horizontally extends across at least the first active area structure, and wherein the second polysilicon structure horizontally extends across at least the first active area structure and the second active area structure.

3. The semiconductor structure of claim 1, wherein the first interconnection structure horizontally extends across at least the second active area structure, and wherein the second interconnection structure overlaps at least the first polysilicon structure and the first interconnection structure.

4. The semiconductor structure of claim 1, wherein the second polysilicon structure horizontally extends across the second active area structure.

5. The semiconductor structure of claim 1 wherein the metal structure overlaps the first interconnection structure.

6. The semiconductor structure of claim 1, wherein the first polysilicon structure does not overlap the second polysilicon structure.

7. The semiconductor structure of claim 1 further comprising a sixth interconnection structure over the first active area structure and the second active area structure.

8. A semiconductor structure comprising:
   a first active structure extending in a first direction;
   a second active structure extending in the first direction, wherein the first active structure does not overlap the second active structure;
   a first polysilicon structure extending in a second direction and overlapping the first active structure;
   a second polysilicon structure extending in the second direction and overlapping the first active structure and the second active structure;
   a first interconnection structure overlapping the second active structure;
   a second interconnection structure overlapping the first interconnection structure and the first polysilicon structure;
   a third polysilicon structure extending over the second active structure and a third active structure; and
   a fourth polysilicon structure extending over the third active structure.

9. The semiconductor structure of claim 8, wherein the first polysilicon structure does not overlap the second polysilicon structure.

10. The semiconductor structure of claim 8, wherein the first interconnection structure extends in the second direction and the second interconnection structure extends in the first direction.

11. The semiconductor structure of claim 8 further comprising a fifth polysilicon structure overlapping the first active structure and the second active structure.

12. The semiconductor structure of claim 8, further comprising:
   a third interconnection structure overlapping the second polysilicon structure;
   a first conductive line over the third interconnection structure; and
   a second conductive line over the second interconnection structure.

13. The semiconductor structure of claim 12 further comprising:
   a fourth interconnection structure overlapping the third polysilicon structure; and
   a fifth interconnection structure overlapping the fourth polysilicon structure,
   wherein the fifth interconnection structure overlaps a fifth polysilicon structure that overlaps the first active structure and the second active structure.

14. The semiconductor structure of claim 12, further comprising:
   a first metal structure over and electrically coupling the first conductive line and the second conductive line.

15. A semiconductor structure comprising:
   a first active structure extending in a first direction;
   a second active structure extending in the first direction;
   a third active structure extending in the first direction, wherein the first active structure, the second active structure and the third active structure do not overlap;
   an isolation region surrounding the first active structure, the second active structure and the third active structure;
   a first polysilicon structure extending in a second direction and overlapping the first active structure, the second direction being substantially perpendicular to the first direction;
   a second polysilicon structure extending in the second direction and overlapping the first active structure and the second active structure;
   a first interconnection structure overlapping the first active structure and the second active structure;
   a second interconnection structure overlapping at least the isolation region;
   a third interconnection structure overlapping the second active structure and the third active structure; and
   a third polysilicon structure overlapping the second active structure between the third interconnection structure and the second polysilicon structure.

16. The semiconductor structure of claim 15, wherein the first interconnection structure and the third interconnection structure extend in the second direction, and the second interconnection structure extends in the first direction.

17. The semiconductor structure of claim 16, wherein the second interconnection structure overlaps the first polysilicon structure and the third interconnection structure.

18. The semiconductor structure of claim 17, wherein the second interconnection structure further overlaps the second polysilicon structure.

19. The semiconductor structure of claim 17, further comprising:
   a fourth interconnection structure overlapping the second polysilicon structure.

20. The semiconductor structure of claim 19, further comprising:
   a first conductive line over the fourth interconnection structure;
   a second conductive line over the second interconnection structure; and
   a first metal structure over and electrically coupling the first conductive line and the second conductive line.

\* \* \* \* \*